(12) United States Patent
Yamamoto et al.

(10) Patent No.: US 6,750,394 B2
(45) Date of Patent: Jun. 15, 2004

(54) THIN-FILM SOLAR CELL AND ITS MANUFACTURING METHOD

(75) Inventors: Hiroshi Yamamoto, Kitakatsuragi-gun (JP); Kenji Wada, Takarazuka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/041,681

(22) Filed: Jan. 10, 2002

(65) Prior Publication Data

US 2002/0134425 A1 Sep. 26, 2002

(30) Foreign Application Priority Data

| Jan. 12, 2001 | (JP) | 2001-004575 |
| Feb. 6, 2001 | (JP) | 2001-030028 |
| Dec. 26, 2001 | (JP) | 2001-394695 |
| Dec. 26, 2001 | (JP) | 2001-394713 |

(51) Int. Cl.$^7$ .................. H01L 31/075; H01L 31/0352
(52) U.S. Cl. .......... 136/258; 136/249; 136/256; 136/246; 136/259; 136/255; 136/261; 257/436; 257/458; 257/464; 257/64; 257/55; 438/96; 438/97; 438/69; 438/71; 438/74
(58) Field of Search ................ 136/258, 249, 136/256, 246, 259, 255, 261; 257/436, 458, 464, 64, 55; 438/96, 97, 69, 71, 74

(56) References Cited

U.S. PATENT DOCUMENTS

| 4,694,116 A | * 9/1987 | Hayashi et al. ........... 136/256 |
| 5,589,008 A | * 12/1996 | Keppner ................. 136/259 |

(List continued on next page.)

FOREIGN PATENT DOCUMENTS

| EP | 893833 A2 | * 1/1999 |
| JP | 1-289173 A | 11/1989 |
| JP | 09-246581 | 9/1997 |
| JP | 10-70294 A | 3/1998 |
| JP | 10-070293 | 3/1998 |
| JP | 10-117006 A | 5/1998 |
| JP | 11-214728 A | 8/1998 |
| JP | 10-294481 A | 11/1998 |
| JP | 2862174 B2 | 12/1998 |

(List continued on next page.)

OTHER PUBLICATIONS

Yamamoto et al, "Effects of Substrates with Different Properties on Microcrystalline Silicon Films", PVSC–11, Sapporo, Japan, 1999.

"Effects of Substrates with Different Surface Morphology on Microcrystalline Silicon Solar Cells", Nasuno et al., p. 829, 6a–C–6, Sep. 2000.

"Effects of Substrates with Different Surface Morphology on Microcrystalline Silicon Solar Cells", Nasuno et al., Apr. 2001, pp. L–303–L305.

"Microcrystalline Silicon Thin–Film Solar Cells Prepared at Low Temperature Using PECVD", Nasuno et al., Korea, 2001, pp. 791–794.

"Microcrystalline Silicon Thin–Film Solar Cells Prepared at Low Temperature Using RF–PECVD", Nasuno et al., Sep. 2000.

"Microcrystalline Silicon Thin–Film Solar Cells Prepared at Low Temperature", Nasuno et al., 2001, pp. A15.5.1–12.

*Primary Examiner*—Alan Diamond
(74) *Attorney, Agent, or Firm*—Nixon & Vanderhye P.C.

(57) ABSTRACT

A thin-film solar cell comprises a set of a transparent conductive layer and a photoelectric conversion layer laminated in this order on a substrate, wherein the photoelectric conversion layer is made of a p-i-n junction, the i-layer is made of a crystalline layer and the transparent conductive layer is provided with a plurality of holes at its surface of the side of the photoelectric conversion layer, each of said holes having irregularities formed on its surface.

40 Claims, 5 Drawing Sheets

U.S. PATENT DOCUMENTS

| | | | |
|---|---|---|---|
| 5,977,477 A | * 11/1999 | Shiozaki | 136/256 |
| 6,072,117 A | * 6/2000 | Matsuyama et al. | 136/256 |
| 6,211,454 B1 | * 4/2001 | Sano | 136/258 |
| 6,323,415 B1 | 11/2001 | Uematsu et al. | |
| 6,331,672 B1 | 12/2001 | Matsuda et al. | |
| 6,459,034 B2 | * 10/2002 | Muramoto et al. | 136/249 |
| 6,465,727 B2 | * 10/2002 | Maruyama et al. | 136/256 |
| 6,512,170 B1 | 1/2003 | Hirata et al. | 136/256 |
| 6,593,522 B2 | 7/2003 | Nakano et al. | 136/256 |
| 2001/0035206 A1 | 11/2001 | Inamasu et al. | |
| 2002/0050289 A1 | * 5/2002 | Wada et al. | 136/256 |

FOREIGN PATENT DOCUMENTS

| | | | |
|---|---|---|---|
| JP | 11-233800 A | | 6/1999 |
| JP | 2974485 | | 9/1999 |
| JP | 11-266027 A | | 9/1999 |
| JP | 11-274530 A | * | 10/1999 |
| JP | 2000-58892 A | | 2/2000 |
| JP | 3072832 | | 6/2000 |
| WO | WO 88/09265 | | 12/1988 |

* cited by examiner

THIN-FILM SOLAR CELL AND ITS MANUFACTURING METHOD

CROSS-REFERENCES TO RELATED APPLICATIONS

This application is related to Japanese application No. 2001-004575 filed on Jan. 12, 2001, Japanese application No. 2001-030028 filed on Feb. 6, 2001, Japanese application No. 2001-394695 filed on Dec. 26, 2001 and Japanese application No. 2001-394695 filed on Dec. 26, 2001, whose priority are claimed under 35 USC §119, the disclosure of which are incorporated by reference in its entirety.

BACKGROUND OF THE INVENTION

1. Field of the Invention

The present invention relates to a thin-film solar cell and its manufacturing method, and more particularly to a thin-film solar cell having a high photoelectric conversion efficiency and its manufacturing method.

2. Description of the Prior Arts

Attention has been put on a solar cell as alternate energy of fossil fuel such as petroleum that has a problem of having a worry about supply and demand in the future as well as a discharge of carbon dioxide which is a cause of global warming.

This solar cell utilizes a p-n junction at a photoelectric conversion layer that converts optical energy into electric power. Silicon has frequently been used in general as a semiconductor constituting this p-n junction.

It is preferable to use single crystalline silicon from the viewpoint of photoelectric conversion efficiency. However, it has a problem concerning a material supply and production of large areal solar cell at low cost.

On the other hand, a thin-film solar cell having a photoelectric conversion layer has been realized, the photoelectric conversion layer being made of amorphous silicon that is advantageous for realizing a solar cell with a large area at low cost.

Further, an investigation has been made for a use of crystalline silicon to a photoelectric conversion layer so as to realize a solar cell achieving both of a high, stabilized photoelectric conversion efficiency to a level of a single crystalline silicon solar cell and a large area and low cost at a level of an amorphous silicon solar cell. In particular, attention has been made on a thin-film solar cell (hereinafter referred to as crystalline silicon thin-film solar cell) in which a crystalline silicon thin-film is formed by using a thin-film forming technique by a chemical vapor deposition (hereinafter referred to as CVD method) like the case of amorphous silicon.

For example, Japanese Unexamined Patent Application No. HEI1-289173 discloses a multi-junction type thin-film solar cell made by laminating a photoelectric conversion element having an active layer of amorphous silicon and a photoelectric conversion element having an active layer of polycrystalline silicon that has a smaller energy gap compared to amorphous silicon. The thin-film solar cell of this type has a structure that solar light is incident from the side of the photoelectric conversion element having an amorphous silicon active layer, thereby having an advantage of more efficiently utilizing solar light compared to a single-junction type. Moreover, a plurality of photoelectric conversion layers is connected in series, to thereby obtaining a high open-circuit voltage. This can make the amorphous silicon active layer thin, so that a deterioration per hour of the photoelectric conversion efficiency attributed to Staebler-Wronski effect can be reduced. Moreover, this type of solar cell has an advantage of manufacturing the amorphous silicon layer and the crystalline silicon layer by the same device. As described above, the thin-film solar cell of this type has various advantages, and therefore, research and development has popularly been made as a means for realizing a highly efficient thin-film solar cell manufactured also at a low cost.

One of the important techniques for realizing a highly efficient thin-film solar cell includes a light confinement effect. The light confinement effect means that irregularities are made on a surface of a transparent conductive layer or a metal layer that is in contact with the photoelectric conversion layer for scattering light at its boundary, thereby extending optical path length for increasing an amount of light absorption at the photoelectric conversion layer.

For example, Japanese Patent No. 1681183 or No. 2862174 discloses a technique for obtaining a substrate for a highly efficient solar cell by defining a size of grain diameter or a size of irregularities of the transparent conductive layer formed on a glass substrate.

An improvement of the photoelectric conversion efficiency by the light confinement effect serves for decreasing a thickness of the photoelectric conversion layer. This can restrain a photo-deterioration, especially in an amorphous silicon solar cell. Further, this can greatly shorten a film-forming time in the case of a crystalline silicon solar cell that requires, due to its light absorption characteristics, a thickness of no less than several micron orders which is several to ten several times thick compared to amorphous silicon. Specifically, the light confinement effect enables to enhance all of high efficiency, stabilization and production with low cost that are significant problems for realizing a thin-film solar cell.

However, the photoelectric conversion efficiency of the crystalline silicon thin-film solar cell is only the same level as that of the amorphous silicon solar cell in spite of an energetic research and development made so far.

H. Yamamoto et al reported in PVSC-11, Sapporo, Japan, 1999 that forming a microcrystalline silicon layer with a plasma CVD method on an Asahi-U substrate obtained by laminating on a glass substrate tin oxide having minute irregularities thereon stimulates a priority growth of silicon grain in a perpendicular direction with respect to the surface of the tin oxide, which produces collisions between crystal grains each growing from different surfaces of irregularities and having a different crystal orientation, thereby generating a great amount of defects. Such defects remarkably deteriorate the photoelectric conversion efficiency, since they become a recombination center of a carrier.

H. Yamamoto et al simultaneously reported that laminating further zinc oxide thickly on the tin oxide having a surface irregularities for making the depth of each irregularity small also stimulates a priority growth of silicon grain in a perpendicular direction with respect to the surface of the tin oxide, which produces collisions between crystal grains each growing from different surfaces of irregularities and having a different crystal orientation, but the defects are less generated since a difference in its orientation is small. Specifically, it is clear that the irregularities on the surface of the substrate are made as smaller as possible for reducing the defects in the crystalline silicon thin-film.

However, making no irregularities or making the irregularities on the surface small brings a result contrary to a technique for obtaining a highly efficient thin-film solar cell by enhancing the light confinement effect.

Japanese Laid-Open Patent Applications No. HEI 10-117006, No. HEI 10-294481, No. HEI 11-214728, No. HEI 11-266027 and No. 2000-58892 disclose a multi-junction type thin-film solar cell having a lower photoelectric conversion element that includes a photoelectric conversion layer made of a crystalline silicon layer and is formed on a back surface electrode on which irregularities are formed, this crystalline silicon layer having a (110) priority crystal orientation surface parallel to the substrate surface. However, these solar cells have an element structure of a sub-straight type in which light is incident from a photoelectric conversion element side.

Therefore, with respect to an element structure of a super-straight type in which light is incident from a transparent substrate side, no finding has been made as for a suitable rough structure achieving both of the reduction of defect density and light confinement effect in the crystalline silicon thin-film.

SUMMARY OF THE INVENTION

The present invention provides a thin-film solar cell comprising a set of a transparent conductive layer and a photoelectric conversion layer laminated in this order on a substrate, wherein the photoelectric conversion layer is made of a p-i-n junction, an i-layer constituting the p-i-n junction is made of a crystalline layer and the transparent conductive layer is provided with a plurality of holes at its surface of the side of the photoelectric conversion layer, each of said holes having irregularities formed on its surface.

The present invention also provides a method for manufacturing a thin-film solar cell characterized in that a surface of a substrate and/or a first transparent conductive layer is etched for forming a plurality of holes on the surface of the first transparent conductive layer upon manufacturing a thin-film solar cell of the above.

The present invention still provides a method for manufacturing a thin-film solar cell characterized in that a first transparent conductive layer is formed so as to have holes on its surface, whereby a plurality of holes are provided on the surface of the first transparent conductive layer upon manufacturing a thin-film solar cell of the above.

The present invention further provides a thin-film solar cell comprising two or more sets of a transparent conductive layer and a photoelectric conversion layer laminated in this order on a substrate, wherein a plurality of holes are provided on a surface at a side of a first photoelectric conversion layer of a first transparent conductive layer that is the closest layer to the substrate as well as on a surface at a side of a second photoelectric conversion layer of a second transparent conductive layer formed on the first transparent conductive layer, each of said holes having irregularities formed on its surface, the photoelectric conversion layer is made of a p-i-n junction, an i-layer constituting the p-i-n junction of the first photoelectric conversion layer is made of an amorphous or a crystalline layer and the i-layer of each of the other photoelectric conversion layers is made of a crystalline layer.

The present invention still another provides a method for manufacturing a thin-film solar cell characterized in that a surface of a substrate and/or a first transparent conductive layer and/or a second transparent conductive layer is etched for forming a plurality of holes on the surface of the first transparent conductive layer and on the surface of a second transparent conductive layer upon manufacturing a thin-film solar cell of the above.

The present invention still further provides a method for manufacturing a thin-film solar cell characterized in that a first transparent conductive layer and/or a second transparent conductive layer is formed so as to have holes on its surface, whereby a plurality of holes are provided on the surface of the first transparent conductive layer and on the surface of a second transparent conductive layer upon manufacturing a thin-film solar cell of the above.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
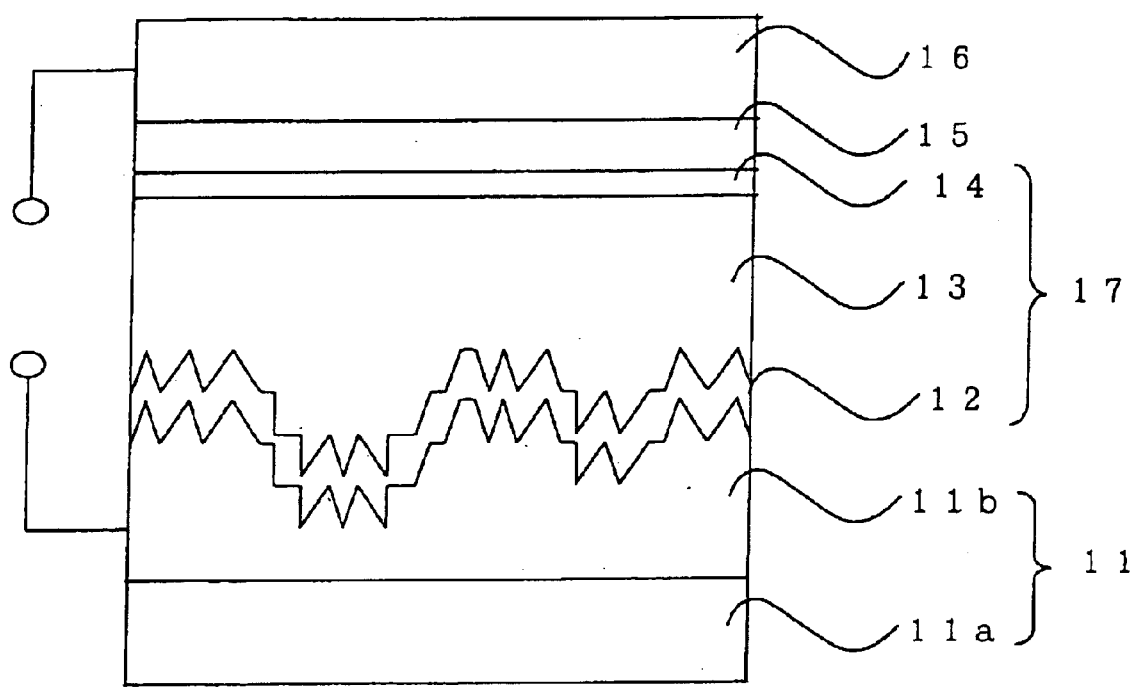
FIG. 1 is a schematic cross-sectional view showing an essential part of a single-junction type thin-film solar cell (Embodiment 1) according to the present invention.

A substrate which can be used for a thin-film solar cell of the present invention is not specifically limited if it supports and strengthens the entire solar cell. A substrate having a heat resistance (e.g., approximately 200° C.) is preferable. Further, a substrate which can be used for a super-straight type solar cell is preferable. Examples of usable materials include glass; heat-resistant high molecular film such as polyimide, PET, PEN, PES, teflon or the like; metal such as stainless steel (SUS), aluminum or the like; and ceramics. These materials can be used singly or in a laminate structure. More preferable materials are a transparent material having heat resistance. Each of these substrates suitably has a thickness of affording a suitable intensity and weight to the substrate, for example, a thickness of approximately 0.1 to 30 mm. Further, each of these substrates may be formed by an insulating film, conductive film, buffer layer or the like or by a combination of these depending upon a using condition of the substrate.

The substrate may be provided with a plurality of holes on its surface, preferably at the side of the transparent conductive layer as described later. Irregularities may be formed on the surface of each hole. It is preferable to set the shape and size of the holes and irregularities in order to produce holes and irregularities at the side of a photoelectric conversion layer of the transparent conductive layer. The shape and size of the holes and irregularities can suitably be adjusted according to a thickness, material or the like of the transparent conductive layer described later. Examples of the specific shape of each hole and irregularity include an approximately cube, rectangular solid, circular cylinder, circular cone, sphere, hemisphere, or the like or a combination of these shapes. Preferable diameter of the hole is approximately 200 to 2000 nm, preferable depth of the hole is approximately 50 to 1200 nm and preferable height difference of the irregularity is 10 to 300 nm.

Irregularities may be formed on the surface other than the holes on the surface of the substrate on which holes are formed. The height difference of irregularities in this case is approximately 10 to 300 nm.

Preferable proportional ratio of the irregularity size to the irregularity space and that of the hole depth to a hole diameter are approximately 0.05 to 3, more preferably approximately 0.1 to 2. From another viewpoint, preferable number density of a hole is approximately 0.1 to 5 numbers per micro square meter, more preferably approximately 0.5 to 2 numbers per micro square meter.

The holes and irregularities are formed on the surface of the substrate by the same manner as a method for forming holes and irregularities on the surface of the transparent conductive layer as described later. More suitable method is a sandblasting.

The transparent conductive layer is not specifically limited. For example, the transparent conductive layer can be formed by a single layer or a laminate structure of a transparent oxide or the like such as $SnO_2$, $In_2O_3$, ZnO, ITO or the like. ZnO is more preferable since it has a high resistance to plasma. The transparent conductive layer may include impurities from the viewpoint of reducing resistivity. Examples of impurities include the elements in Group III of the periodic table such as gallium, aluminum or the like. Its preferable impurity concentration is approximately $5 \times 10^{20}$ to $5 \times 10^{21}/cm^3$, for example. A preferable thickness of the transparent conductive layer is approximately 0.1 nm to 2 microns. The thickness of each of the second, third and so on of the transparent conductive layers is approximately 0.5 to 50 nm. These layers can be formed on the substrate by a sputtering method, vacuum deposition method, EB deposition method, atmospheric pressure CVD method, low pressure CVD method, sol-gel method, electrodeposition method and the like. The sputtering method is preferable among these methods, because the transparency and resistivity of the transparent conductive layer are easy to be controlled so as to be suitable for the crystalline silicon thin-film solar cell.

The transparent conductive layer is provided with a plurality of holes on its surface at the side of a photoelectric conversion layer described later. Each hole is preferably provided with irregularities on its surface. The formation of both the holes and the irregularities is more preferable because their formation can produce sufficient scattering or reflection of solar light and therefore can realize both reduction in the defect density and improvement in light absorption characteristics which provides high photoelectric conversion efficiency. These holes and irregularities have a number, size, shape, depth and the like which can produce suitable scattering or reflection of solar light for desired light absorption characteristics of the photoelectric conversion layer and can reduce the defect density of the photoelectric conversion layer formed above the holes and irregularities.

For example, preferable holes and irregularities are those that can generate sufficient light scattering effect not only for a middle wavelength of approximately 450 to 650 nm of the central wavelength of the solar spectrum but also for a long wavelength of the central wavelength of the solar spectrum. Specific examples include an approximately cube, rectangular solid, circular cylinder, circular cone, sphere, hemisphere, or the like or a combination of these shapes.

The diameter of the hole is approximately 200 to 2000 nm, preferably about 400 to 1200 nm. The depth of the hole is approximately 50 to 1200 nm, preferably about 100 to 800 nm. The height difference of the irregularity is approximately 10 to 300 nm, preferably about 20 to 200 nm. Preferable proportional ratio of the irregularity size to the irregularity space and that of the hole depth to a hole diameter are approximately 0.05 to 3, more preferably approximately 0.1 to 2. From another viewpoint, preferable number density of a hole is approximately 0.1 to 5 numbers per micro square meter, more preferably approximately 0.5 to 2 numbers per micro square meter. In order not to generate a defect in the crystalline photoelectric conversion layer, the height difference of the irregularity formed on the surface of the hole formed on the surface of the second transparent conductive layer is smaller than that formed on the surface of the hole formed on the surface of the first transparent conductive layer. Preferable proportional ratio of the irregularity size to the irregularity space is approximately 0.1 to 1.

Irregularities may be formed on the surface other than the holes on the surface of the substrate on which holes are formed, so as to generate a satisfactory light scattering or reflecting state. The height difference of the irregularities in this case is approximately 10 to 300 nm, preferably about 20 to 200 nm. The proportional ratio of the irregularity size to the irregularity space or a number density of a hole is approximately the same as described above.

This can produce sufficient light scattering effect for the solar ray incident to the photoelectric conversion layer (also to the crystalline photoelectric conversion layer). Although the shape of the irregularity generates high or low light scattering effect, it does not limit the generation of the effect.

The transparent conductive layer is preferably oriented with respect to the substrate surface. The phrase that the transparent conductive layer is oriented with respect to the substrate surface means that the diffraction peak to a specific surface in the X-ray diffraction is 60% or more, preferably 70% or more, with respect to the sum of the integral intensity of all the diffraction peaks. This eliminates an influence of the plane direction dependency in the transparent conductive layer due to a processing such as an etching or the like, thereby obtaining a uniform hole or uniform irregularities formed on the surface of the transparent conductive layer at the side of the photoelectric conversion layer, i.e., thereby unifying the photoelectric conversion characteristics of the thin-film solar cell. Moreover, the depth of the hole formed after the etching processing becomes large with the improvement of the orientation, whereby long wavelength light having a wavelength of 700 nm or more can effectively be absorbed. For example, in case where zinc oxide is used for the transparent conductive layer, the integrating intensity of the (0001) diffraction peak obtained by X-ray diffraction method is preferably 70% or more with respect to the sum of the integrating intensity of all the diffraction peaks from the viewpoint of electrical and optical characteristics.

There are various methods for forming a plurality of holes and irregularities described above on the surface of the transparent conductive layer, such as a chemical method for processing the surface of the transparent conductive layer with an etchant or the like, a physical method for irradiating ion or plasma to the surface of the transparent conductive layer, a method wherein conditions for manufacturing the transparent conductive layer with a magnetron sputtering method are set so as to naturally generate the holes and irregularities, a method for making holes and irregularities on the transparent conductive layer formed on the substrate by executing an etching or mechanical processing to the substrate itself as described above, or the like.

The chemical method is preferable since the surface shape of the transparent conductive layer can easily be controlled by suitably changing a type of an etchant, its concentration, etching time or the like. In the case of the processing with the etchant, a preferable method is the one wherein the transparent conductive layer is dipped into the etchant considering the reduction of the manufacturing cost. Examples of the etchant includes a mixture of one or two kinds of acid solution such as hydrochloric acid, sulfuric acid, nitric acid, fluoric acid, acetic acid, formic acid, hydrogen peroxide, perchloric acid or the like. Preferable acid solution is hydrogen chloride and acetic acid. The solution described above can be used with a concentration of, for example, approximately 0.05 to 5 wt. %. It is preferable in particular that the comparatively weak acid solution such as acetic acid is used with a concentration of approximately 0.15 to 5 wt. %. Examples of alkali solution includes a mixture of one or two kinds of alkali solution such as sodium hydroxide, ammonia, potassium hydroxide, calcium hydroxide, sodium hydroxide or the like. Sodium hydroxide is more preferable. The solution described above is preferably used with a concentration of approximately 1 to 10 wt. %.

As for the physical method, holes and irregularities can be formed on the surface of the transparent conductive layer by controlling a type of ion or plasma, its generating method, kinetic energy or the like.

Considering the method for controlling the film-forming condition, the film-forming condition can be controlled, for example, as disclosed in Japanese Patent No. 2862174. This can control the crystal grain size and orientation of the transparent conductive layer, so that the holes and irregularities can be formed on the surface of the transparent conductive layer.

A sandblasting method disclosed in the Japanese Laid-Open Patent Application No. HEI 10-70294 is taken as one example for forming the irregularities on the substrate.

The above-mentioned methods may singly be used or may be used in combination of two or more methods.

In case where the thin-film solar cell of the invention is a multi-junction type (i.e., a type having two or more sets of a transparent conductive layer and a photoelectric conversion layer laminated in this order), each of the transparent conductive layer may be provided with holes and/or irregularities on the surface thereof at the side of each photoelectric conversion layer, or some transparent conductive layers, preferably only a first and second transparent conductive layers, are provided with holes and irregularities on the surface thereof at the side of each photoelectric conversion layer.

The photoelectric conversion layer is formed on the transparent conductive layer by a p-i-n junction. In particular, an i-layer among p-layer, n-layer and i-layer which constitute the p-i-n junction is made of a crystalline layer in a single-junction type (i.e., a type having one set of a transparent conductive layer and a photoelectric conversion layer laminated in this order). In the case of a multi-junction type, the i-layer in the first photoelectric conversion layer may be preferably made of an amorphous layer or may be made of a crystalline layer. The i-layer in the second photoelectric conversion layer is preferably a crystalline layer in the multi-junction type of a two-layered structure. As for a multi-junction type having three or more layers laminated, the i-layer in the second photoelectric conversion layer may be amorphous or crystalline layer, while the photoelectric conversion layer such as the third photoelectric conversion layer that is arranged at the outermost side is preferably a crystalline layer. The word "crystalline" includes, if a special note is not given, all crystal conditions such as not only a polycrystal and single crystal but also a crystal component so-called microcrystal. The word "amorphous" means a crystal component called amorphous or non-crystal, if a special note is not given. The crystalline or amorphous layer may be partially included therein, may be preferably included in the whole i-layer. Examples of materials for constituting the i-layer includes an element semiconductor such as silicon, silicon alloy (for example, alloyed silicon such as $Si_xC_{1-x}$ to which carbon is added, $Si_xGe_{1-x}$ to which germanium is added or silicon to which any other impurities are added) or the like.

The p-layer or n-layer which constitutes the photoelectric conversion layer may be entirely or partially a crystalline layer, or may be entirely an amorphous layer. The same materials for constituting the i-layer can be used for constituting these p-layer and n-layer.

It is preferable that, in the single-junction type thin-film solar cell, all of the p-layer, n-layer and i-layer are made of a layer including crystalline silicon, or i-layer as well as either one of the p-layer and n-layer that is in contact with the transparent conductive layer are made of a layer including crystalline silicon. Further, all of the p-layer, n-layer and i-layer of all the photoelectric conversion layers may not include a crystalline layer in the multi-junction type thin-film solar cell.

The inclusion of the layer made of crystalline silicon or silicon alloy in the photoelectric conversion layer enables to sufficiently utilize long wavelength light of 700 nm or more that cannot be utilized for the photoelectric conversion in amorphous silicon.

The p-layer constituting the photoelectric conversion layer includes Group III element (for example, boron, aluminum, germanium, indium, titanium or the like). The p-layer may be a single layer, or may be a laminate structure wherein the concentration of Group III element is different in each layer or gradually changes. The concentration of Group III element is, for example, approximately 0.01 to 8 atom %. The thickness of the p-layer is, for example, approximately 1 to 200 nm.

The p-layer can be formed by any method if a layer made of silicon or silicon alloy is formed to have a p-type conductivity. Typical method for forming such a layer is CVD method. Examples of the CVD method here includes atmospheric pressure CVD, low pressure CVD, plasma CVD, ECR plasma CVD, high-temperature CVD, low-temperature CVD or the like. Preferable one is a method with a high frequency of a frequency band from RF to VHF, ECR plasma CVD method, or its combination. When the plasma CVD method is used, examples of conditions include a frequency of approximately 10 to 200 MHz, power of approximately several watts to several kilowatts, pressure in a chamber of approximately 0.1 to 20 Torr, and substrate temperature of approximately room temperature to 600° C.

Examples of silicon-containing gas used for forming the p-layer include $SiH_4$, $Si_2H_6$, $SiF_4$, $SiH_2Cl_2$, $SiCl_4$ or the like.

The silicon-containing gas is generally used as dilution gas with inert gas such as $H_2$, Ar, He, Ne, Xe or the like. $H_2$ gas is most preferable. The mixture ratio of the silicon-containing gas and dilution gas is constant or gradually changed. Its suitable value is approximately 1:1 to 1:100 by volum. Gas optionally including Group III element, for example, $B_2H_6$ may be used as doping gas.

The mixture ratio of silicon-containing gas and gas including Group III element can suitably be adjusted depending upon a size of a film-forming device such as CVD or a concentration of Group III element to be obtained. This mixture ratio is, for example, approximately 1:0.001 to 1:1 by volume, being constant or gradually changing. The Group III element may be doped simultaneous with the film-formation of the silicon layer as described above, while it may be doped by an ion implantation, surface treatment of the silicon layer, solid-phase diffusion or the like after the silicon layer is formed. Fluorine-containing gas may optionally be added to silicon-containing gas. Examples of fluorine-containing gas include $F_2$, $SiF_4$, $SiH_2F_2$ or the like. Example of the amount in this case of fluorine-containing gas is approximately 0.01 to 10 times as large as the amount of dilution gas such as hydrogen gas.

The i-layer does not substantially show p-type and n-type conductivities, but it may show a significantly weak p-type or n-type conductivity if the photoelectric conversion function is not deteriorated. The i-layer can be formed by the above-mentioned method, most preferably by plasma CVD method. The thickness thereof in that case is, for example, approximately 0.1 to 10 microns. Substantially the same gas as in the p-layer except for not including Group III element can be used for forming the i-layer. Substantially the same film-forming conditions as in the p-layer can be adapted to the formation of the i-layer.

The n-layer is not specifically limited if it is the one generally used in the p-i-n junction of the solar cell. It can be formed by the same manner as the p-layer and i-layer except for using gas containing Group V element such as $PH_3$ or the like. Examples of impurity serving as a donor include phosphorus, arsenic, antimony or the like. The concentration of impurity is approximately $10^{18}$ to $10^{20}$ $cm^{-3}$. The thickness of the n-layer is, for example, approximately 10 to 100 nm.

Although the p-layer, n-layer and i-layer may be formed under a corresponding different film-forming condition as a layer containing or not containing amorphous component or a layer containing or not containing crystalline component, they are preferably formed continuously by plasma CVD method with the gas flow amount being changed and the other conditions being optionally changed. This continuous formation can realize an integral layer showing no interruption of sedimentation from p-layer to n-layer.

The total thickness of the photoelectric conversion layer including the amorphous i-layer is preferably the same or more times as thick as the average height difference of the irregularities formed on the hole surface on the first transparent conductive layer in order to obtain uniform characteristics as well as to control a leakage due to a pinhole or the like. Specifically, it is suitably four times as thick as the average height difference of the irregularities or below that for maintaining a hole size required for generating light scattering effect.

The total thickness of the photoelectric conversion layer including the crystalline i-layer is preferably the same or more of the average height difference of the irregularities formed on the hole surface on the transparent conductive layer in order to obtain uniform characteristics as well as to control a leakage due to a pinhole or the like. Specifically, it is suitably ten times as thick as the average height difference of the irregularities or below that for maintaining a hole size required for generating light scattering effect. Specific thickness is approximately 0.2 to 10 microns.

A photoelectric conversion layer having remarkably less defect is formed in case where the photoelectric conversion layer, particularly the layer made of the crystalline i-layer, has a ratio $I_{220}/I_{111}$ of 5 or more where $I_{220}$ is the integral intensity of (220) X-ray diffraction and $I_{111}$ is the integral intensity of (111) X-ray diffraction. Such photoelectric conversion layer shows a high photoelectric conversion efficiency, thus preferable.

The thin-film solar cell of the present invention may be a super-straight type in which light is incident from the substrate side or may be a sub-straight type in which light is incident from the photoelectric conversion layer side. More preferable one is a super-straight type thin-film solar cell having one set of the transparent electrode and photoelectric conversion layer laminated in this order on the transparent substrate or a plurality sets of the transparent electrode and photoelectric conversion layer formed on the transparent substrate in parallel or in series and further having a conductive layer on the photoelectric conversion layer. If the multi-junction type thin-film solar cell of the present invention includes a first transparent conductive layer, amorphous photoelectric conversion layer, second transparent conductive layer and crystalline photoelectric conversion layer laminated in this order on the transparent substrate, it may comprise three or more photoelectric conversion layers such as a third transparent conductive layer, third photoelectric conversion layer, fourth transparent conductive layer and so forth. The third, fourth and the like transparent conductive layers in this case can be substantially the same as the first and second transparent conductive layers. The third, fourth and the like photoelectric conversion layers may be amorphous, preferably crystalline. It can substantially the same as the aforesaid photoelectric conversion layer. Any conductive layer, besides the transparent conductive layer, is adapted here if it may be formed from a material usable as a general electrode material. One or more layers such as buffer layer, intermediate layer, conductive layer, insulating layer, protecting layer or the like may optionally be formed between the substrate, transparent conductive layer and p-, n- and i-layers. Further, a solar cell module may be obtained by a plurality of this type of thin-film solar cells or by a combination with a thin-film solar cell having another structure. In the sub-straight type solar cell, a metallic substrate or a substrate on which a metal is coated is used, whereby the transparent conductive layer functions as a scattering layer of light reflected from the metal surface.

The embodiments of the thin-film solar cell according to the present invention will be explained in detail hereinbelow. The present invention is not limited to these embodiments.

EXAMPLE 1

A single-junction type thin-film solar cell in this Example is a super-straight type solar cell. As shown in FIG. 1, a crystalline silicon photoelectric conversion layer 17, back surface reflecting layer 15 and back surface electrode 16 are laminated in this order onto a thin-film solar cell substrate 11 comprising a glass plate 11a and a transparent conductive layer 11b formed on the glass plate 11a.

The crystalline silicon photoelectric conversion layer 17 is made of a p-type crystalline silicon layer 12, i-type crystalline silicon layer 13 and n-type crystalline silicon layer 14.

Formed on the surface of the transparent conductive layer 11b are a great number of holes having approximately a semi-sphere and reaching not to the glass plate 11a. Irregularities are provided on the surface of each hole and on the surface on which the holes are not formed.

The single-junction type thin-film solar cell of this type was manufactured as follows.

A zinc oxide film serving as the transparent conductive layer 11b was formed on the plane glass plate 11a so as to have a thickness of 1200 nm with a magnetron sputtering method at a substrate temperature of 150° C. under a film-forming pressure of 0.3 Torr, thus obtaining the thin-film solar cell substrate 11.

Gallium was added so as to have a concentration of approximately $1 \times 10^{21}/cm^3$ to the transparent conductive layer 11b. As a result, the sheet resistance of the obtained transparent conductive layer 11b was 6 ohms/cm$^2$ and transmittance to light of 800 nm wavelength was 80%. When the X-ray diffraction method was performed to the transparent conductive layer 11b, the integral intensity of (0001) diffraction peak was 75% to the sum of the integral intensity of all the diffraction peaks.

Subsequently, the surface of the transparent conductive layer 11b was etched. First, the substrate 11 was dipped into 1 wt. % acetic acid solution having temperature of 25° C. for 80 seconds, and then the surface thereof was fully washed with pure water.

Observing the surface shape of the transparent conductive layer 11b after etching by a scanning electron microscope, the surface was found to be provided with a great number of holes each having a diameter of approximately 200 to 1400 nm and having approximately a spheres shape. The number density was 0.8 $\mu m^{-2}$.

Figure 2:
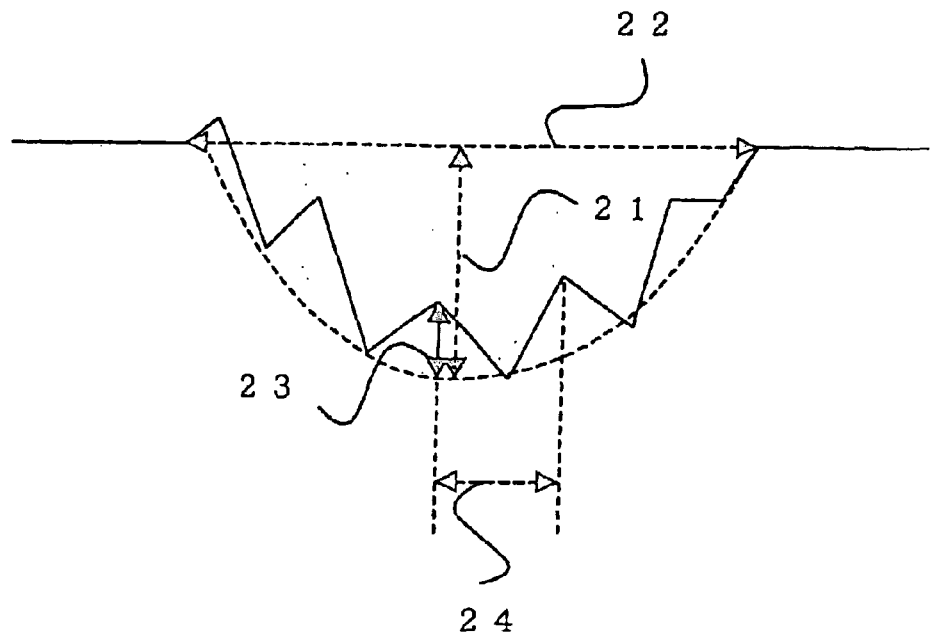
FIG. 2 is a typical view for explaining a surface shape of a transparent conductive layer in a thin-film solar cell according to the present invention.

This hole and surface shape in the vicinity of the hole were observed with an atomic force microscope. FIG. 2 shows a schematic surface shape of the transparent conductive layer 11b.

In FIG. 2, a depth 21 of one hole formed on the surface of the transparent conductive layer 11b had a distribution of about 80 to 1000 nm. The ratio of the hole depth 21 to a hole diameter 22 was in a range of about 0.1 to 1. Further, irregularities were formed on the surface of the hole. The size 23 of each irregularity (a height difference of each irregularity) was distributed from about 10 to 280 nm, while a space 24 between each irregularity was about 100 to 900 nm. The ratio of the irregularity size 23 to the irregularity space 24 was within the range of about 0.1 to 1. Further, the size of each irregularity formed other than the surface of the hole was approximately 10 nm or less.

Subsequently, the p-type crystalline silicon layer 12 having a thickness of 20 nm, the i-type crystalline silicon layer 13 having a thickness of 2 microns and n-type crystalline silicon layer 14 having a thickness of 30 nm were laminated in this order onto the transparent conductive layer 11b with a high-frequency plasma CVD method, thereby obtaining the crystalline silicon photoelectric conversion layer 17. The substrate temperature upon film-formation was 200° C. at each layer.

The p-type crystalline silicon layer 12 was formed by using gas obtained by diluting SiH$_4$ gas with H$_2$ gas having a flow rate ratio five times as large as that of SiH$_4$ gas, and further by adding B$_2$H$_6$ gas in an amount of 0.01% with respect to the flow rate of SiH$_4$ gas. The same material gas except for B$_2$H$_6$ gas as used for forming the p-type crystalline silicon layer 12 was used for forming the i-type crystalline silicon layer 13, while the n-type crystalline silicon layer 14 was formed by using SiH$_4$ gas to which PH$_3$ gas was added by 0.01% with respect to the flow rate of SiH$_4$ gas.

After the obtained substrate 11 was removed from a plasma CVD apparatus, the X-ray diffraction method was performed to the crystalline silicon photoelectric conversion layer 17, resulting in that the ratio $I_{220}/I_{111}$ of the integral intensity $I_{220}$ of (220) X-ray diffraction peak to the integral intensity $I_{111}$ of (110) X-ray diffraction peak was 3. The actually obtained X-ray diffraction peak was not the information of the i-type crystalline silicon layer 12 alone in the crystalline silicon photoelectric conversion layer 17. However, it is considered to reflect the crystal orientation of the i-type crystalline silicon layer 13, since the thickness of each p-type and n-type crystalline silicon layer 12 and 14 is very thin compared to the thickness of the i-type crystalline silicon layer 13.

Table 1 shows the surface shape of the transparent conductive layer 11b and the orientation of the crystalline silicon photoelectric conversion layer 17.

Thereafter, zinc oxide was formed as the back surface reflecting layer 15 with a magnetron sputtering method to have a thickness of 50 nm and silver was formed as the back surface electrode 16 with an electron beam vapor deposition method to have a thickness of 500 nm, thereby obtaining a single-junction type thin-film solar cell of a super-straight type in which light is incident from the glass plate side 11a.

Shown in Table 2 was the current-voltage characteristics of the obtained thin-film solar cell under the irradiating condition of AM1.5 (100 mW/cm$^2$).

EXAMPLE 2

A single-junction type thin-film solar cell was manufactured by the same manner as in the Example 1 except that the substrate was dipped into acetic acid solution for 240 seconds upon etching the surface of the transparent conductive layer 11b.

Observing the surface shape of the transparent conductive layer 11b before forming the crystalline silicon photoelectric conversion layer 17 by a scanning electron microscope, the surface was found to be provided with a great number of holes each having a diameter of approximately 400 to 1000 nm and having approximately a sphere shape. The number density was 1 $\mu m^{-2}$.

Figure 3:
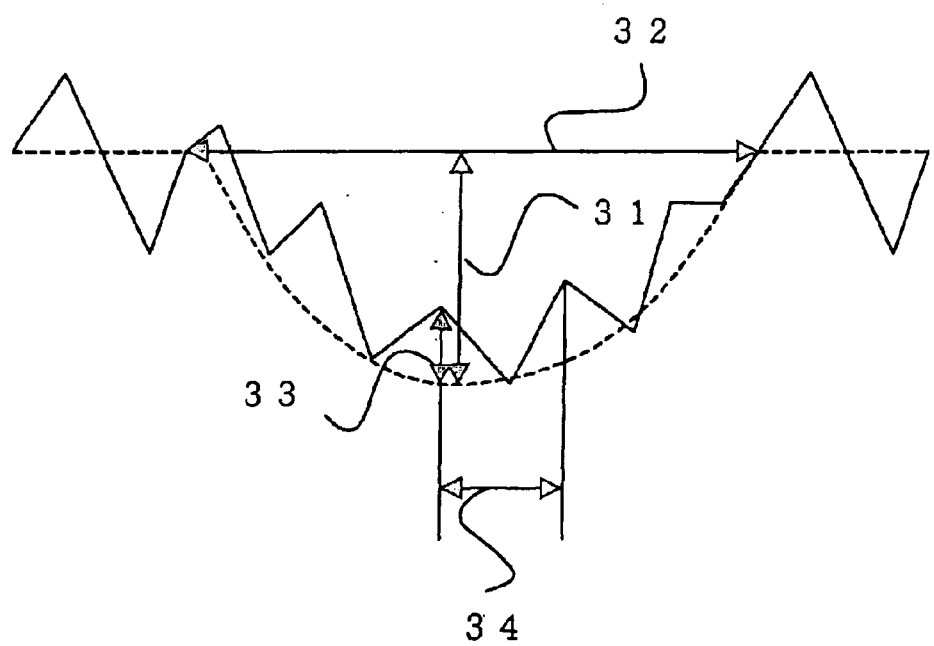
FIG. 3 is a typical view for explaining a surface shape of a transparent conductive layer in a thin-film solar cell according to the present invention.

The surface shape was observed with an atomic force microscope after forming the crystalline silicon photoelectric conversion layer 17 by the same manner as in the Example 1 for minutely checking the surface shape. FIG. 3 shows a schematic surface shape of the transparent conductive layer 11b observed by the atomic force microscope.

A depth 31 of one hole had a distribution of about 100 to 700 nm. The ratio of the hole depth 31 to a hole diameter 32 was in a range of about 0.1 to 1.

Further, irregularities were formed on the surface of the hole and the surface on which the holes were not formed. A size 33 of each irregularity (height difference of each irregularity) was distributed from about 20 to 200 nm, while a space 34 between each irregularity was about 200 to 800 nm. The irregularities formed other than the holes were 20 to 40 nm. The ratio of the irregularity size 33 to the irregularity space 34 was within the range of about 0.1 to 1.

It is considered that the shapes of each hole and irregularity formed on the surface of the transparent conductive layer 11b were unified compared to the Example 1 due to a long etching time.

Table 1 shows the surface shape of the transparent conductive layer 11b and the orientation of the crystalline silicon photoelectric conversion layer 17 in this Example, while shown in Table 2 was the current-voltage characteristics of the obtained thin-film solar cell under the irradiating condition of AM1.5 (100 mW/cm$^2$).

EXAMPLE 3

A single-junction type thin-film solar cell was manufactured by the same manner as in the Example 1 except that SiH$_4$ gas diluted by H$_2$ gas having a flow rate ratio of 30 times as large as that of SiH$_4$ gas was used as material gas for forming the i-type crystalline silicon layer 13.

Table 1 shows the surface shape of the transparent conductive layer 11b and the orientation of the crystalline silicon photoelectric conversion layer 17 in this Example, while shown in Table 2 was the current-voltage characteristics of the obtained thin-film solar cell under the irradiating condition of AM1.5 (100 mW/cm$^2$).

COMPARATIVE EXAMPLE 1

A single-junction type thin-film solar cell was manufactured by the same manner as in the Example 1 except that used transparent conductive layer formed on a plane glass plate (corresponding to 11a) was the one having tin oxide formed by an atmospheric pressure CVD method and zinc oxide formed by a magnetron sputtering method for covering the tin oxide, as well as that the etching was not executed.

The tin oxide was manufactured by a technique disclosed in the Japanese Patent No. 2862174. Specifically, a glass plate on which a silicon oxide film was formed was heated to 600° C., and then, solution obtained by diluting SnCl$_4$, water, methanol and fluoric acid with N$_2$ gas was sprayed onto the glass plate, thereby obtaining tin oxide with a surface shape having irregularities thereon, this shape having an average height of irregularities of 150 nm, average space between irregularities of 180 nm, a height difference of each irregularity to a space between each irregularity of approximately 0.5 to 2. An approximately circular hole was not found on the surface of this tin oxide.

The average thickness of this tin oxide was 600 nm, sheet resistance was 10 ohms/cm$^2$ and transmittance to light of 800 nm wavelength was 78%.

The zinc oxide was provided for preventing a reduction due to hydrogen plasma generating in the crystalline silicon layer. Its thickness was thin such as 30 nm, hardly imparting an influence to the irregularities on the surface of the tin oxide.

When the X-ray diffraction method was performed by the same manner as in the Example 1 after forming the crystalline silicon photoelectric conversion layer 17, the ratio $I_{220}/I_{111}$ of the integral intensity $I_{220}$ of (220) diffraction peak to the integral intensity $I_{111}$ of (111) diffraction peak was 1.5.

Table 1 shows the surface shape of the transparent conductive layer 11b and the orientation of the crystalline silicon photoelectric conversion layer 17 in this Example, while shown in Table 2 was the current-voltage characteristics of the obtained thin-film solar cell under the irradiating condition of AM1.5 (100 mW/cm$^2$).

COMPARATIVE EXAMPLE 2

A single-junction type thin-film solar cell was manufactured by the same manner as in the Example 1 except that the substrate was dipped into acetic acid solution for 60 seconds upon etching the surface of the transparent conductive layer 11b.

Table 1 shows the surface shape of the transparent conductive layer 11b and the orientation of the crystalline silicon photoelectric conversion layer 17 after forming the transparent conductive layer 11b but before forming the crystalline silicon photoelectric conversion layer 17, while shown in Table 2 was the current-voltage characteristics of the obtained thin-film solar cell under the irradiating condition of AM1.5 (100 mW/cm$^2$).

EXAMPLE 4

A single-junction type thin-film solar cell was manufactured by the same manner as in the Example 1 except that, after etching the surface of the transparent conductive layer 11b made of zinc oxide, zinc oxide was further formed thereon to have a thickness of 50 nm.

The film-forming conditions of the zinc oxide film after etching processing were different from those in the Example 1. Specifically, the film-forming pressure was 3 mTorr.

When the X-ray diffraction method was performed to the transparent conductive layer 11b formed on the glass substrate under these film-forming conditions, a random orientation was observed.

Observing the surface shape of the transparent conductive layer 11b before forming the crystalline silicon photoelectric conversion layer 17 by a scanning electron microscope, irregularities were formed all over the surface of the transparent conductive layer 11b, that was different from the Example 1. The height difference of each irregularity has a distribution of about 20 to 280 nm (at the surface other than the hole 20 to 50 nm). The transparent conductive layer 11b was formed under a random orientation condition grew in a band, whereby the irregularities were formed all over the surface.

Table 1 shows the surface shape of the transparent conductive layer 11b and the orientation of the crystalline silicon photoelectric conversion layer 17, while shown in Table 2 was the current-voltage characteristics of the obtained thin-film solar cell under the irradiating condition of AM1.5 (100 mW/cm$^2$).

EXAMPLE 5

Figure 4:
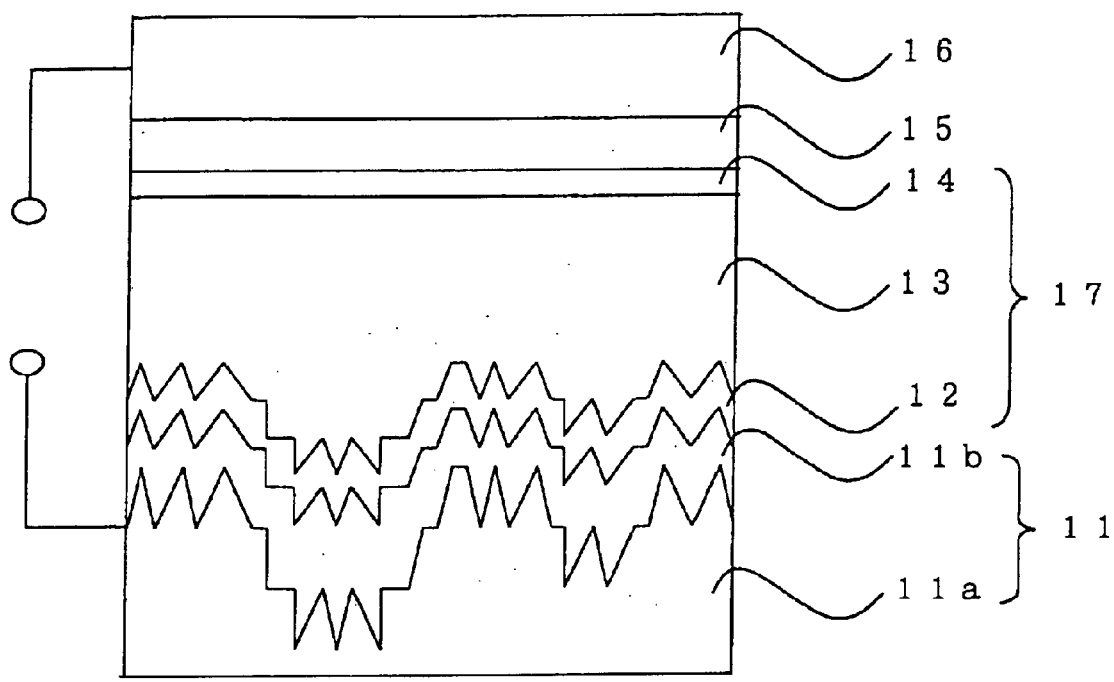
FIG. 4 is a schematic cross-sectional view showing an essential part of a single-junction type thin-film solar cell (Embodiment 5) according to the present invention.

A single-junction type thin-film solar cell was manufactured by the same manner as in the Example 1 except that a substrate 11 for a thin-film solar cell was prepared as shown in FIG. 4 using a glass plate 11a having a processed surface shape instead of the plane glass plate, the substrate 11 having thereon a transparent conductive layer 11b with a thickness of 1000 nm.

The surface shape of the glass plate 11a was processed with a sandblasting by using abrasive sand made of alumina and having an average grain diameter of 1 micron. The sandblasting process conditions were set as follows: the spray pressure was about 3 to 4 kg/cm$^2$, spray distance was about 8 cm, spray angle was 90 degree, speed of the processing table was 25 mm/minute and spray amount was 50 g/minute.

Observing the surface shape of the transparent conductive layer 11b before forming the crystalline silicon photoelectric conversion layer 17 by a scanning electron microscope, the surface was found to be provided with a great number of holes each having a diameter of approximately 400 to 1000 nm and having approximately a sphere shape. The number density was 1 $\mu m^{-2}$.

The surface shape of each hole and the surface shape in the vicinity of the hole were measured with an atomic force microscope for minutely checking these surface shapes. The depth of one hole had a distribution of about 100 to 700 nm. The ratio of the hole depth to a hole diameter was in a range of about 0.1 to 1.

Further, irregularities were formed on the surface of the hole and the surface on which the holes were not formed. The size of each irregularity was distributed from about 20 to 1000 nm, while the space between each irregularity was about 100 to 400 nm. The ratio of the irregularity size to the irregularity space was within the range of about 0.1 to 1.

Table 1 shows the surface shape of the transparent conductive layer 11b and the orientation of the crystalline silicon photoelectric conversion layer 17, while shown in Table 2 was the current-voltage characteristics of the obtained thin-film solar cell under the irradiating condition of AM1.5 (100 mW/cm$^2$).

COMPARATIVE EXAMPLE 3

A single-junction type thin-film solar cell was manufactured by the same manner as in the Example 5 except for the processing condition of the surface of the glass plate 11a.

The surface shape of the glass plate 11a was processed with a sandblasting by using abrasive sand made of alumina and having an average grain diameter of 20 micron. The sandblasting process conditions were set as follows: the spray pressure was about 3 to 4 kg/cm$^2$, spray distance was about 8 cm, spray angle was 90 degree, speed of the processing table was 250 mm/minute and spray amount was 50 g/minute.

Observing the surface shape of the transparent conductive layer 11b before forming the crystalline silicon photoelectric conversion layer 17 by a scanning electron microscope, the surface was found to be provided with a great number of holes each having a diameter of approximately 800 to 3000 nm and having approximately a sphere shape. The number density was 0.3 $\mu m^{-2}$.

The surface shape of each hole and the surface shape in the vicinity of the hole were measured with an atomic force microscope for minutely checking these surface shapes. The depth of one hole had a distribution of about 700 to 2000 nm. The ratio of the hole depth to a hole diameter was in a range of about 0.5 to 2.

Further, irregularities were formed on the surface of the hole and the surface on which the holes were not formed. The size of each irregularity was distributed from about 150 to 500 nm, while the space between each irregularity was about 200 to 800 nm. The ratio of the irregularity size to the irregularity space was within the range of about 0.5 to 2.

Table 1 shows the surface shape of the transparent conductive layer 11b and the orientation of the crystalline silicon photoelectric conversion layer 17, while shown in Table 2 was the current-voltage characteristics of the obtained thin-film solar cell under the irradiating condition of AM1.5 (100 mW/cm$^2$).

TABLE 1

| | Etching Time (sec.) Other Forming Condition | Surface Shape of Second Transparent Conductive Layer | | | | |
|---|---|---|---|---|---|---|
| | | Hole Diameter (nm) | Hole Depth (nm) | Irregularity Size on Hole (nm) | Irregularity Size on other than Hole (nm) | $I_{220}/I_{111}$* |
| Ex 1 | 180 | 200–1400 | 80–1000 | 10–280 Average 120 | <10 | 3 |
| Ex 2 | 240 | 400–1000 | 100–700 | 20–200 Average 150 | 20–40 | 3 |
| Ex 3 | 240 | 400–1000 | 100–700 | 20–200 Average 150 | 20–40 | 5.5 |
| Ex 4 | 180 ZnO/ZnO | 200–1400 | 80–1000 | 20–280 Average 130 | 20–50 | 3 |
| Ex 5 | — | 400–1000 | 100–700 | 30–120 Average 80 | 30–120 | 3 |
| Co Ex 1 | ZnO/SnO$_3$ | — | — | — | Average 150 | 1.5 |
| Co Ex 2 | 60 | 50–200 | 10–100 | <10 | <10 | 3 |
| Co Ex 3 | — | 800–3000 | 700–2000 | 150–500 Average 350 | 150–500 | 1.4 |

*: Orientation of crystalline silicon photoelectric conversion layer

TABLE 2

| | Short-Circuit Electric Current (mA/cm$^2$) | Open-Voltage (V) | Fill Factor | Photoelectric Conversion Efficiency (%) |
|---|---|---|---|---|
| Ex 1 | 25.0 | 0.53 | 0.70 | 9.28 |
| Ex 2 | 25.8 | 0.53 | 0.70 | 9.57 |
| Ex 3 | 25.8 | 0.55 | 0.72 | 10.22 |
| Ex 4 | 26.0 | 0.53 | 0.70 | 9.65 |

TABLE 2-continued

|  | Short-Circuit Electric Current (mA/cm$^2$) | Open-Voltage (V) | Fill Factor | Photoelectric Conversion Efficiency (%) |
| --- | --- | --- | --- | --- |
| Ex 5 | 25.5 | 0.53 | 0.70 | 9.46 |
| Co Ex 1 | 24.9 | 0.50 | 0.66 | 8.22 |
| Co Ex 2 | 22.8 | 0.53 | 0.72 | 8.70 |
| Co Ex 3 | 25.4 | 0.49 | 0.65 | 8.09 |

As shown in Tables 1 and 2, the irregularities having the average height of 150 nm were formed on the transparent conductive layer in the Comparative Example 1, while holes were formed in the Examples 1 and 2 larger in size than the irregularities of the Comparative Example 1 and having a diameter greater than its depth. Further, formed on each surface of these holes were irregularities smaller than the holes. The open-circuit voltage obtained in the Examples 1 and 2 was higher than that of the Comparative Example 1. This is attributed to the improvement in orientation of the transparent conductive layer compared to the Comparative Example 1, whereby the orientation of the crystalline silicon photoelectric conversion layer formed thereon was maintained to thereby prevent introduction of the defects.

Further in the Examples 1 and 2, not only the open-circuit voltage was higher that that in the Comparative Example 1, but also the short-circuit electric current was the same as that in the Comparative Example 1. This shows that the formation of the crystalline silicon photoelectric conversion layer on the transparent conductive layers in the Examples 1 and 2 enables to prevent the introduction of the defect density into the crystalline silicon photoelectric conductive layer due to the irregularities of the substrate with the light confinement effect maintained.

Moreover, the short-circuit electric current was higher in the Example 1 than in the Example 2. Considering that there is little difference between the Example 1 and Example 2 in the depth of each hole and the size of irregularities formed on the surface of each hole, a high light confinement effect is considered to be produced due to the formation of the irregularities each having a size of 10 nm or more on the surface other than the hole surface in the Example 2.

In the Example 3, the orientation $I_{220}/I_{111}$ of the crystalline silicon photoelectric conversion layer was 5.5 that was higher than the orientation $I_{220}/I_{111}$ of 3 of the crystalline silicon photoelectric conversion layer in each Example 1 and 2, so that a high open-voltage and fill factor were shown in the Example 3. This brings a conclusion that the preferable orientation $I_{220}/I_{111}$ of the crystalline silicon photoelectric conversion layer was 5 or more.

In the Comparative Example 2, the light confinement effect did not occur so that the short-circuit electric current was reduced, since the holes and irregularities were excessively smaller than those in the Examples 1 and 2. The Comparative Example 3 showed not only the reduced open-voltage and fill factor but also the reduced orientation of the crystalline silicon photoelectric conversion layer. This brings a conclusion that the defect was introduced into the crystalline silicon photoelectric conversion layer thereby reducing the open-voltage, since the depth of hole and size of the irregularities were excessively large.

The transparent conductive layer in each Example 4 and 5 was formed to have equivalent holes and irregularities to those of the Example 2 with the laminate structure of the transparent conductive layer or sandblast processing of the glass substrate, thereby obtaining a single-junction type thin-film solar cell having the current-voltage characteristics equivalent to those in the Example 2. It is considered from the above result that the importance is put on the surface shape of the transparent conductive layer for forming a thin-film solar cell having a high photoelectric conversion efficiency, for which the laminate structure of the transparent conductive layer or sandblast processing of the glass substrate or its combination is effective.

EXAMPLE 6

Figure 5:
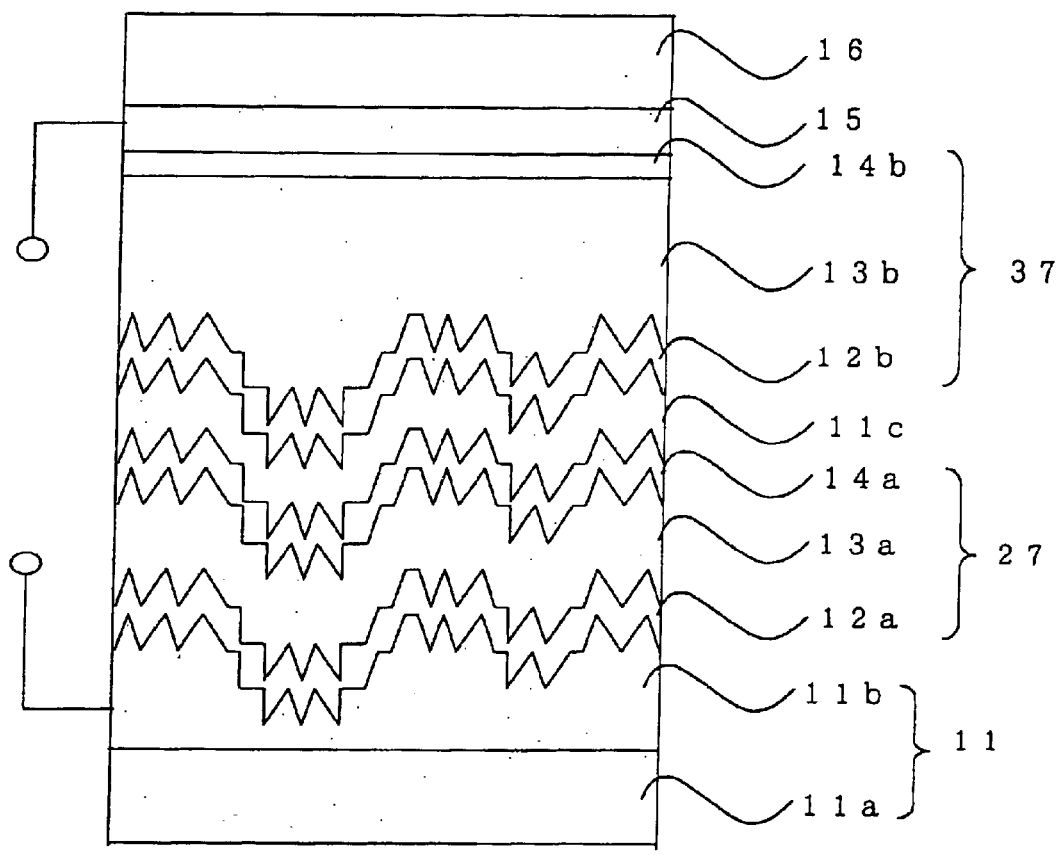
FIG. 5 is a schematic cross-sectional view showing an essential part of a multi-junction type thin-film solar cell (Embodiment 6) according to the present invention.

A multi-junction type thin-film solar cell of a super-straight type in this Example has substantially the same structure as that shown in FIG. 5. This thin-film solar cell has a substrate for a thin-film solar cell comprising a glass plate and a first transparent conductive layer formed thereon. Formed on this substrate are an amorphous silicon photoelectric conversion layer 27, second transparent conductive layer 11c, crystalline silicon photoelectric conversion layer 37, back surface reflecting layer 15 and back surface electrode 16 in this order. Formed on each surface of the first and second transparent conductive layers are a great number of holes each having approximately a sphere shape and reaching not to the glass plate 11a like the Example 1. The amorphous silicon photoelectric conversion layer 27 is made of a p-type amorphous silicon layer 12a, i-type amorphous silicon layer 13a and n-type amorphous silicon layer 14a, and the crystalline silicon photoelectric conversion layer 37 is made of a p-type crystalline silicon layer 12b, i-type crystalline silicon layer 13b and n-type crystalline silicon layer 14b.

The multi-junction type thin-film solar cell of this type was manufactured as follows.

A zinc oxide film serving as the first transparent conductive layer was formed on the plane glass plate so as to have a thickness of 1200 nm with a magnetron sputtering method at a substrate temperature of 150° C. under a film-forming pressure of 0.3 mTorr thus obtaining the thin-film solar cell substrate 11. Gallium of approximately $1\times10^{21}/cm^{-3}$ was added to the first transparent conductive layer. As a result, the sheet resistance of the obtained first transparent conductive layer was 6 ohms/cm$^2$ and transmittance to light of 800 nm wavelength was 80%. When the X-ray diffraction method was performed to the first transparent conductive layer, the integral intensity of (0001) diffraction peak was 75% to the sum of the integral intensity of all the diffraction peaks.

Subsequently, the surface of the first transparent conductive layer was etched. The substrate 11 was dipped into 1 wt. % acetic acid solution having temperature of 25° C. for 200 seconds, and then the surface thereof was fully washed with pure water. Observing the surface shape of the obtained first transparent conductive layer by a scanning electron microscope, the surface was found to be provided with a great number of holes each having a diameter of approximately 200 to 1600 nm and having approximately a sphere shape, these holes not reaching to the glass plate.

Subsequently, the p-type amorphous silicon layer having a thickness of 20 nm, the i-type amorphous silicon layer having a thickness of 300 nm and n-type amorphous silicon layer having a thickness of 30 nm were laminated in this order onto the substrate with a high-frequency plasma CVD method by using a high-frequency plasma CVD apparatus, thereby obtaining the amorphous silicon photoelectric conversion layer. The substrate temperature upon forming each layer was 200° C.

The p-type amorphous silicon layer was formed by using gas obtained by diluting $SiH_4$ gas with $H_2$ gas having a flow rate ratio five times as large as that of $SiH_4$ gas, and further by adding $B_2H_6$ gas in an amount of 0.01% with respect to the flow rate of $SiH_4$ gas. The same material gas except for $B_2H_6$ gas as used for forming the p-type amorphous silicon layer was used for forming the i-type amorphous silicon layer, while the n-type amorphous silicon layer was formed by using $SiH_4$ gas to which $PH_3$ gas was added by 0.01% with respect to the flow rate of $SiH_4$ gas.

The obtained substrate was removed from a plasma CVD apparatus, and then, zinc oxide with a thickness of 5 nm was formed as the second transparent conductive layer by a magnetron sputtering method under the same condition as the first transparent conductive layer.

Observing the surface shape of the second transparent conductive layer by a scanning electron microscope, the surface was found to be provided with a great number of holes each having a diameter of approximately 200 to 1400 nm and having approximately a sphere shape. The surface shape of the hole and the surface shape in the vicinity of the hole were observed with an atomic force microscope for a minute check. FIG. 2 shows a schematic surface shape of the second transparent conductive layer. The depth 21 of one hole had a distribution of about 80 to 1000 nm. The ratio of the hole depth to the average hole diameter 22 was in a range of about 0.1 to 1. Further, irregularities were formed on the surface of the hole and the surface on which the holes were not formed. The size 23 of each irregularity was distributed from about 10 to 280 nm, while the space 24 between each irregularity was about 100 to 900 nm. The ratio of the irregularity size 23 to the irregularity space 24 was within the range of about 0.1 to 1. Table 3 shows the surface shape of the second transparent conductive layer.

Again, the p-type crystalline silicon layer having a thickness of 20 nm, the i-type crystalline silicon layer having a thickness of 2 microns and n-type crystalline silicon layer having a thickness of 30 nm were laminated in this order onto the second transparent conductive layer with a high-frequency plasma CVD method, thereby obtaining the crystalline silicon photoelectric conversion layer. The substrate temperature upon forming each layer was 200° C. The p-type crystalline silicon layer was formed by using gas obtained by diluting $SiH_4$ gas with $H_2$ gas having a flow rate fifty times as large as that of $SiH_4$ gas, and further by adding $B_2H_6$ gas in an amount of 0.01% with respect to the flow rate of $SiH_4$ gas for fully crystallizing the silicon layer. The same material gas as used for forming the p-type crystalline silicon layer except for $B_2H_6$ gas was used for forming the i-type crystalline silicon layer, while the n-type crystalline silicon layer was formed by using $SiH_4$ gas to which $PH_3$ gas was added by 0.01% with respect to the flow rate of $SiH_4$ gas.

After being removed from a plasma CVD apparatus, the X-ray diffraction method was performed to the obtained photoelectric conversion layer, resulting in that the ratio $I_{220}/I_{111}$ of the integral intensity $I_{220}$ of (220) X-ray diffraction peak to the integral intensity $I_{111}$ of (110) X-ray diffraction peak was 3. The actually obtained X-ray diffraction peak was not the information of the i-type crystalline silicon layer alone in the crystalline silicon photoelectric conversion layer. However, it is considered to reflect the crystal orientation of the i-type crystalline silicon layer, since the thickness of each p-type and n-type crystalline silicon layers is very thin compared to the thickness of the i-type crystalline silicon layer. Table 3 shows the orientation of the crystalline silicon photoelectric conversion layer.

Thereafter, zinc oxide was formed as the back surface reflecting layer with a magnetron sputtering method to have a thickness of 50 nm and silver was formed as the back electrode 16 with an electron beam vapor deposition method to have a thickness of 500 nm, thereby obtaining a multi-junction type thin-film solar cell of a super-straight type in which light is incident from the glass plate side.

Shown in Table 4 was the current-voltage characteristics of the obtained thin-film solar cell under the irradiating condition of AM1.5 ($100 \text{ mW/cm}^2$).

EXAMPLE 7

A multi-junction type thin-film solar cell was manufactured by the same manner as in the Example 6 except that the substrate was dipped into acetic acid solution for 280 seconds upon etching the surface of the first transparent conductive layer.

Observing the surface shape of the second transparent conductive layer by the same manner as in the Example 6, after forming the amorphous silicon photoelectric conversion layer and the second transparent conductive layer but before forming the crystalline silicon photoelectric conversion layer, by a scanning electron microscope, the surface was found to be provided with a great number of holes each having a diameter of approximately 400 to 1400 nm and having approximately a sphere shape. The number density was 1 $\mu m^{-2}$.

The surface shape of the hole and the surface shape in the vicinity of the hole were observed with an atomic force microscope by the same manner as in the Example 6 for a minute check. FIG. 3 shows a schematic surface shape of the second transparent conductive layer.

The depth 31 of one hole had a distribution of about 100 to 700 nm. The ratio of the average hole depth 31 to the average hole diameter 32 was in a range of about 0.1 to 1.

Further, irregularities were formed on the surface of the hole and the surface on which the holes were not formed. The size 33 of each irregularity was distributed from about 20 to 200 nm (those formed on the surface other than the holes: about 20 to 40 nm), while the space 34 between each irregularity was about 200 to 800 nm. The ratio of the irregularity size 33 to the irregularity space 34 was within the range of about 0.1 to 1.

It is considered that the shapes of holes and irregularities formed on the surface of the first transparent conductive layer were unified compared to the Example 6 due to a long etching time. Consequently, the shapes of holes and irregularities formed on the surface of the second transparent conductive layer were also unified.

After forming the crystalline silicon photoelectric conversion layer, the X-ray diffraction method was performed, resulting in that the ratio $I_{220}/I_{111}$ of the integral intensity $I_{220}$ of (220) X-ray diffraction peak to the integral intensity $I_{111}$ of (110) X-ray diffraction peak was 3. This amount was the same as that of the Example 6.

Table 3 shows the surface shape of the second transparent conductive layer and the orientation of the crystalline silicon photoelectric conversion layer, while shown in Table 4 is the current-voltage characteristics of the obtained multi-junction type thin-film solar cell under the irradiating condition of AM1.5 ($100 \text{ mW/cm}^2$).

EXAMPLE 8

A multi-junction type thin-film solar cell was manufactured by the same manner as in the Example 7 except that SiH$_4$ gas diluted by H$_2$ gas having a flow rate of 30 times as large as that of SiH$_4$ gas was used as material gas for forming the i-type crystalline silicon layer.

After forming the crystalline silicon photoelectric conversion layer, the X-ray diffraction method was performed, resulting in that the ratio I$_{220}$/I$_{111}$ of the integral intensity I$_{220}$ of (220) X-ray diffraction peak to the integral intensity I$_{111}$ of (110) X-ray diffraction peak was 5.5.

Table 3 shows the surface shape of the second transparent conductive layer and the orientation of the crystalline silicon photoelectric conversion layer, while shown in Table 4 is the current-voltage characteristics of the obtained multi-junction type thin-film solar cell under the irradiating condition of AM1.5 (100 mW/cm$^2$).

COMPARATIVE EXAMPLE 4

A multi-junction type thin-film solar cell was manufactured by the same manner as in the Example 6 except that used first transparent conductive layer formed on a plane glass plate was the one having tin oxide formed by an atmospheric pressure CVD method and zinc oxide formed by a magnetron sputtering method for covering the tin oxide, as well as that the etching was not executed.

The tin oxide was manufactured by a technique disclosed in the Japanese Patent No. 2862174. Specifically, a glass plate on which silicon oxide film was formed was heated to 600° C., and then, solution obtained by diluting SnCl$_4$, water, methanol and fluoric acid with N$_2$ gas was sprayed onto the glass plate, thereby obtaining tin oxide with a surface shape having irregularities thereon, this shape having an average height of irregularity of 150 nm, average space between each irregularity of 180 nm. The average thickness of this tin oxide was 600 nm, sheet resistance was 10 ohms/cm$^2$ and transmittance to light of 800 nm wavelength was 78%. The zinc oxide was provided for preventing a reduction due to hydrogen plasma generating in the crystalline silicon layer. Its thickness was thin such as 30 nm, hardly imparting an influence to the irregularities on the surface of the tin oxide.

Observing the surface shape of the second transparent conductive layer by the same manner as in the Example 6, after forming the amorphous silicon photoelectric conversion layer and the second transparent conductive layer but before forming the crystalline silicon photoelectric conversion layer, by a scanning electron microscope, the average height difference between each irregularity was 100 nm and the average space between each irregularity was 150 nm. The ratio of the irregularity height difference to the irregularity space was in the range of about 0.5 to 2. The holes having a shape of approximately sphere observed in the Examples 6 and 7 were not found in this Example.

After forming the crystalline silicon photoelectric conversion layer, the X-ray diffraction method was performed, resulting in that the ratio I$_{220}$/I$_{111}$ of the integral intensity I$_{220}$ of (220) X-ray diffraction peak to the integral intensity I$_{111}$ of (110) X-ray diffraction peak was 1.5.

Table 3 shows the surface shape of the second transparent conductive layer and the orientation of the crystalline silicon photoelectric conversion layer, while shown in Table 4 is the current-voltage characteristics of the obtained multi-junction type thin-film solar cell under the irradiating condition of AM1.5 (100 mW/cm$^2$).

COMPARATIVE EXAMPLE 5

A multi-junction type thin-film solar cell was manufactured by the same manner as in the Example 8 except that the substrate was dipped into acetic acid solution for 80 seconds upon etching the surface of the transparent conductive layer.

Table 3 shows the surface shape of the second transparent conductive layer and the orientation of the crystalline silicon photoelectric conversion layer, while shown in Table 4 is the current-voltage characteristics of the obtained multi-junction type thin-film solar cell under the irradiating condition of AM1.5 (100 mW/cm$^2$).

COMPARATIVE EXAMPLES 6 and 7

Each multi-junction type thin-film solar cell was manufactured by the same manner as in the Example 6 except that the thickness of the i-type amorphous silicon layer of each Comparative Example was set to 100 nm and 500 nm.

Table 3 shows the surface shape of the second transparent conductive layer and the orientation of the crystalline silicon photoelectric conversion layer, while shown in Table 4 is the current-voltage characteristics of the obtained multi-junction type thin-film solar cell under the irradiating condition of AM1.5 (100 mW/cm$^2$).

EXAMPLE 9

A multi-junction type thin-film solar cell was manufactured by the same manner as in the Example 6 except that, after etching the surface of the transparent conductive layer made of zinc oxide, zinc oxide was further formed thereon to have a thickness of 50 nm.

The film-forming conditions of the transparent conductive layer after etching processing were different from those in the Example 6. Specifically, the film-forming pressure was 3 mTorr.

When the X-ray diffraction method was performed to the transparent conductive layer formed on the glass substrate under these film-forming conditions, a random orientation was observed.

The surface shape of the second transparent conductive layer was observed by the same manner as in the Example 6 by a scanning electron microscope, after forming the amorphous silicon photoelectric conversion layer and the second transparent conductive layer but before forming the crystalline silicon photoelectric conversion layer.

As a result of the observation, it was found that irregularities were formed all over the surface of the transparent conductive layer, that was different from the Example 6. The height difference between each irregularity had a distribution of about 20 to 280 nm (at the surface other than the hole: 20 to 50 nm). The transparent conductive layer formed under a random orientation condition grew in a band, whereby the irregularities were formed all over the surface.

Table 3 shows the surface shape of the second transparent conductive layer and the orientation of the crystalline silicon photoelectric conversion layer, while shown in Table 4 is the current-voltage characteristics of the obtained multi-junction type thin-film solar cell under the irradiating condition of AM1.5 (100 mW/cm$^2$).

EXAMPLE 10

Figure 6:
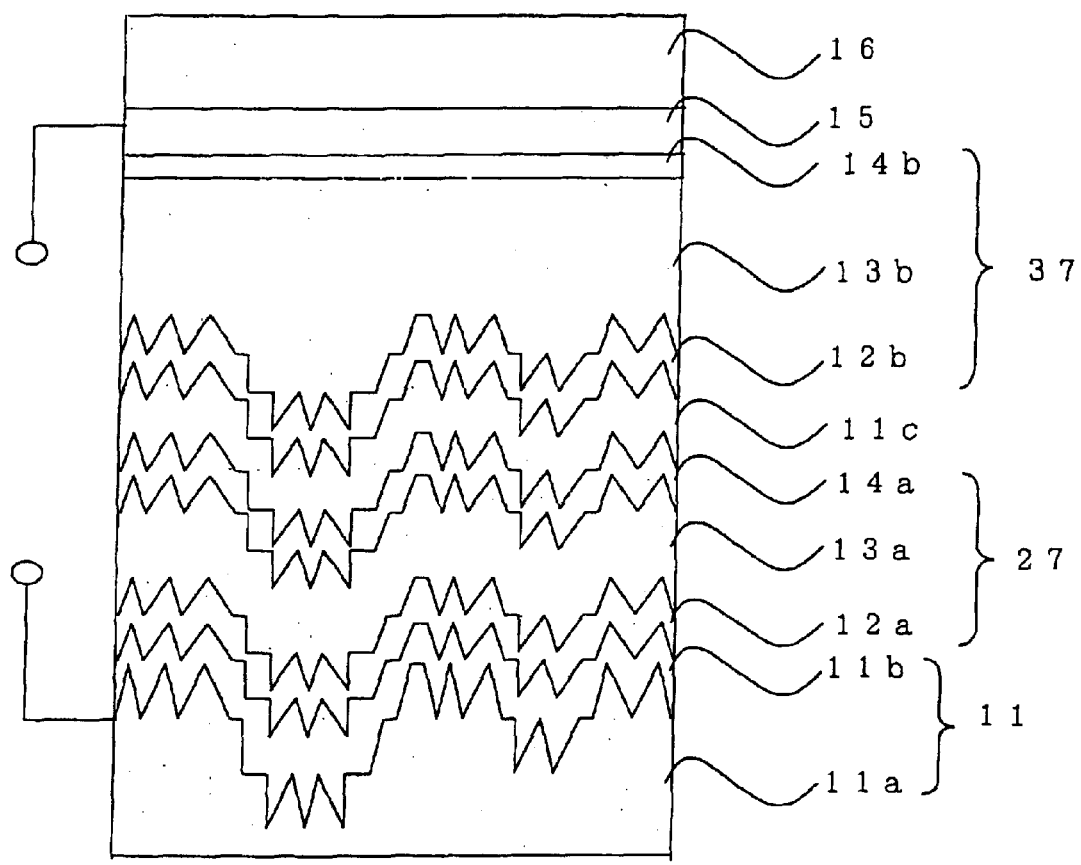
FIG. 6 is a schematic cross-sectional view showing an essential part of a multi-junction type thin-film solar cell (Embodiment 10) according to the present invention.

A multi-junction type thin-film solar cell was manufactured (see FIG. 6) by the same manner as in the Example 6 except that a substrate for a thin-film solar cell was prepared using a glass plate having a processed surface shape instead of the plane glass plate, the substrate having thereon a transparent conductive layer with a thickness of 1000 nm.

The surface shape of the glass plate was processed with a sandblasting by using abrasive sand made of alumina and having an average grain diameter of 1 micron. The sandblasting process conditions were set as follows: the spray pressure was about 3 to 4 kg/cm², spray distance was about 8 cm, spray angle was 90 degree, speed of the processing table was 25 mm/minute and spray amount was 50 g/minute.

Observing the surface shape of the second transparent conductive layer by the same manner as in the Example 6, after forming the amorphous silicon photoelectric conversion layer and the second transparent conductive layer but before forming the crystalline silicon photoelectric conversion layer, by a scanning electron microscope, the surface was found to be provided with a great number of holes each having a diameter of approximately 400 to 1000 nm and having approximately a sphere shape. The number density was 1 A m⁻².

The depth of one hole had a distribution of about 100 to 700 nm. The ratio of the hole depth to the hole diameter was in a range of about 0.1 to 1. Further, irregularities were formed on the surface of the hole and the surface on which the holes were not formed. The size of each irregularity was distributed from about 30 to 120 nm, while the space between each irregularity was about 100 to 400 nm. The ratio of the irregularity size to the irregularity space was within the range of about 0.1 to 1.

Table 3 shows the surface shape of the second transparent conductive layer and the orientation of the crystalline silicon photoelectric conversion layer, while shown in Table 4 is the current-voltage characteristics of the obtained multi-junction type thin-film solar cell under the irradiating condition of AM1.5 (100 mW/cm²).

COMPARATIVE EXAMPLE 8

A multi-junction type thin-film solar cell was manufactured by the same manner as in the Example 10 except for the processing condition of the surface of the glass plate.

The surface shape of the glass plate was processed with a sandblasting by using abrasive sand made of alumina and having an average grain diameter of 20 micron. The sandblasting process conditions were set as follows: the spray pressure was about 3 to 4 kg/cm², spray distance was about 8 cm, spray angle was 90 degree, speed of the processing table was 250 mm/minute and spray amount was 50 g/minute.

Observing the surface shape of the second transparent conductive layer by the same manner as in the Example 6, after forming the amorphous silicon photoelectric conversion layer and the second transparent conductive layer but before forming the crystalline silicon photoelectric conversion layer, by a scanning electron microscope, the surface was found to be provided with a great number of holes each having a diameter of approximately 800 to 3000 nm and having approximately a sphere shape. The number density was 0.3 $\mu m^{-2}$.

The depth of one hole had a distribution of about 700 to 2000 nm. The ratio of the hole depth to the hole diameter was in a range of about 0.5 to 2.

Further, irregularities were formed on the surface of the hole and the surface on which the holes were not formed. The size of each irregularity was distributed from about 150 to 500 nm, while the space between each irregularity was about 200 to 800 nm. The ratio of the irregularity size to the irregularity space was within the range of about 0.5 to 2.

Table 3 shows the surface shape of the second transparent conductive layer and the orientation of the crystalline silicon photoelectric conversion layer, while shown in Table 4 is the current-voltage characteristics of the obtained multi-junction type thin-film solar cell under the irradiating condition of AM1.5 (100 mW/cm²).

TABLE 3

| | | Surface Shape of Second Transparent Conductive Layer | | | | |
|---|---|---|---|---|---|---|
| | Etching Time (sec.) Other Forming Condition | Hole Diameter (nm) | Hole Depth (nm) | Irregularity Size on Hole (nm) | Irregularity Size on other than Hole (nm) | $I_{220}/I_{111}$. |
| Ex 6 | 200 | 200–1400 | 80–1000 | 10–280 Average 120 | <10 | 3 |
| Ex 7 | 280 | 400–1400 | 100–700 | 10–200 Average 150 | 20–40 | 3 |
| Ex 8 | 280 | 400–1400 | 100–700 | 10–200 Average 150 | 20–40 | 5.5 |
| Ex 9 | 200 ZnO/ZnO | 200–1400 | 80–1000 | 20–280 Average 130 | 20–50 | 3 |
| Ex 10 | — | 400–1000 | 100–700 | 30–120 Average 80 | 30–120 | 3 |
| Co Ex 4 | ZnO/SnO₂ | — | — | — | Average 100 | 1.5 |
| Co Ex 5 | 80 | 50–200 | 10–100 | <10 | <10 | 3 |
| Co Ex 6 | 200 i-layer** 100 nm | 200–1400 | 80–1000 | 10–280 Average 120 | <10 | 3 |
| Co Ex 7 | 200 i-layer** | 200–1400 | 80–1000 | 10–280 Average | <10 | 3 |

TABLE 3-continued

| | Etching | Surface Shape of Second Transparent Conductive Layer | | | | |
|---|---|---|---|---|---|---|
| | Time (sec.) Other Forming Condition | Hole Diameter (nm) | Hole Depth (nm) | Irregularity Size on Hole (nm) | Irregularity Size on other than Hole (nm) | $I_{220}/I_{111}$* |
| Co Ex 8 | 500 nm — | 800–3000 | 700–2000 | 100 150–500 Average 350 | 150–500 | 1.4 |

*: Orientation of crystalline silicon photoelectric conversion layer
**i-layer: i-type amorphous silicon layer

TABLE 4

| | Short-Circuit Electric Current (mA/cm$^2$) | Open-Voltage (V) | Fill Factor | Photoelectric Conversion Efficiency (%) |
|---|---|---|---|---|
| Ex 6 | 12.8 | 1.205 | 0.695 | 10.72 |
| Ex 7 | 13.6 | 1.204 | 0.694 | 11.36 |
| Ex 8 | 13.8 | 1.226 | 0.712 | 12.05 |
| Ex 9 | 13.9 | 1.205 | 0.695 | 11.64 |
| Ex 10 | 13.4 | 1.202 | 0.692 | 11.15 |
| Co Ex 4 | 13.0 | 1.088 | 0.656 | 9.28 |
| Co Ex 5 | 10.7 | 1.205 | 0.698 | 9.00 |
| Co Ex 6 | 12.9 | 0.987 | 0.584 | 7.37 |
| Co Ex 7 | 11.4 | 1.202 | 0.692 | 9.48 |
| Co Ex 8 | 13.3 | 1.093 | 0.645 | 9.38 |

As shown in Tables 3 and 4, the irregularities having an average thickness of 100 nm were formed on the transparent conductive layer in the Comparative Example 4, while holes in the Examples 6 and 7 were larger in size than the irregularities of the Comparative Example 4 and having a diameter greater than its depth. Further, formed on each surface of these holes were irregularities smaller than the holes. The open-circuit voltage obtained in the Examples 6 and 7 was higher than that of the Comparative Example 4. This is attributed to the improvement in orientation of the crystalline silicon photoelectric conversion layer compared to the Comparative Example 4, whereby the orientation of the crystalline silicon photoelectric conversion layer formed thereon was maintained to thereby prevent introduction of the defects.

Further in the Examples 6 and 7, not only the open-circuit voltage was higher that that in the Comparative Example 4, but also the short-circuit electric current was the same as that in the Comparative Example 4. This shows that the formation of the crystalline silicon photoelectric conversion layer on the transparent conductive layers in the Examples 6 and 7 enables to prevent the introduction of the defect density into the crystalline silicon photoelectric conductive layer due to the irregularities of the substrate with the light confinement effect maintained.

Moreover, the short-circuit electric current was higher in the Example 7 than in the Example 6. Considering that there is little difference between the Example 6 and Example 7 in the depth of each hole and the size of each irregularity formed on the surface of each hole, a high light confinement effect is considered to be produced due to the formation of the irregularities each having a size of 10 nm or more on the surface other than the hole surface in the Example 7.

In the Example 8, the orientation $I_{220}/I_{111}$ of the crystalline silicon photoelectric conversion layer was 5.5 that was higher than the orientation $I_{220}/I_{111}$ of 3 of the crystalline silicon photoelectric conversion layer in each Example 6 and 7, so that a high open-voltage and fill factor were shown in the Example 8. This brings a conclusion that the preferable orientation $I_{220}/I_{111}$ of the crystalline silicon photoelectric conversion layer was 5 or more.

In the Comparative Example 5, the light confinement effect did not occur so that the short-circuit electric current was reduced, since the holes and irregularities were smaller than those in the Examples 6 and 7. The Comparative Example 5 showed not only the reduced open-voltage and fill factor but also the reduced orientation of the crystalline silicon photoelectric conversion layer. This brings a conclusion that the defect was introduced into the crystalline silicon photoelectric conversion layer to thereby reduce the open-voltage, since the depth of each hole and the size of each irregularity were excessively large.

The amorphous silicon photoelectric conversion layer was formed onto the first transparent conductive layer, whereby the defect was not introduced into the photoelectric conversion layer due to the irregularities. Therefore, the light confinement effect can be enhanced by forming on the surface of the first transparent conductive layer the irregularities greater than those formed on the second transparent conductive layer.

On the other hand, the thicker the thickness of the i-type amorphous silicon layer becomes, the smaller the irregularity size becomes in the Comparative Examples 6 and 7. This shows that the irregularities on the surface of the second transparent conductive layer become smaller than those on the first transparent conductive layer by forming the amorphous silicon photoelectric conversion layer on the first transparent conductive layer. Specifically, it is understood that the formation of the amorphous silicon photoelectric conversion layer on the first transparent conductive layer is suitable for achieving both of the reduction in the defect density and high light confinement effect.

In the Comparative Example 6, little change was found in the value of the short-circuit electric current, while the values of the open-voltage and fill factor were reduced. It is understood from this result that a defect such as a pinhole occurs due to an excessively thin amorphous silicon photoelectric conversion layer, to thereby produce a short circuit. On the other hand, little change was found in the values of the open-voltage and fill factor, while the values of short-circuit electric current was reduced in the Comparative Example 7. It is understood from this result that the structure of the surface of the second transparent oxide layer is insufficient for producing the light confinement effect due to an excessively thick amorphous silicon photoelectric conversion layer. Therefore, it is preferable that the thickness of the amorphous silicon photoelectric conversion layer is set so as to be suitable for the irregularity height of the first transparent conductive layer. Specifically, the thickness of the amorphous silicon photoelectric conversion layer is preferably first or more and fourth or less as large as the average height difference of the irregularities on the first transparent conductive layer.

The transparent conductive layer in each Example 9 and 10 was formed to have equivalent holes and irregularities to those of the Example 7 with the laminate structure of the transparent conductive layer or sandblast processing of the glass substrate, to thereby obtaining a thin-film solar cell having the current-voltage characteristics equivalent to those in the Example 9. It is considered from the above result that the importance is put on the surface shape of the transparent conductive layer for forming a thin-film solar cell having a high photoelectric conversion efficiency, for which the laminate structure of the transparent conductive layer or sandblast processing of the glass substrate or its combination is effective.

The present invention can afford a multi-junction type thin-film solar cell that can cause a scattering or a reflecting state of solar ray suitable for light absorption characteristics of amorphous and crystalline photoelectric conversion layers, that can achieve both of the increase in light absorbing amount and defect density in a crystalline silicon layer due to the light confinement effect, and that has a high photoelectric conversion efficiency.

In case that the substrate is provided with a plurality of holes and irregularities formed thereon, the irregularities formed on the surface of each hole on the first transparent conductive layer and having a height difference smaller than that formed on the surface of the holes on the second transparent conductive layer can afford a crystalline photoelectric conversion layer which is less in defect.

When the holes and irregularities formed on the surface of the second transparent conductive layer have a predetermined size, a sufficient light scattering effect can be produced with respect not only to a middle wavelength light in the area of 450 to 650 nm which is a central wavelength of solar spectrum but also to light having longer wavelength.

The formation of the irregularities of the surface of the second transparent conductive layer on which holes are formed can significantly promote the light confinement effect.

The thin-film solar cell having a first and/or second transparent conductive layer made mainly of zinc oxide can provide a high conversion efficiency at low cost. Further, the aforesaid thin-film solar cell can realize to utilize light-scattering or reflection at the reverse junction between the amorphous silicon photoelectric conversion layer and the crystalline silicon photoelectric conversion layer.

When the amorphous silicon photoelectric conversion layer has a predetermined thickness, uniform characteristics can be obtained and further, a leakage due to a pinhole or the like can be controlled.

In case that the first transparent conductive layer is oriented with respect to the substrate surface, a photoelectric conversion layer having remarkably less defect is formed in case where the photoelectric conversion layer is made of a p-n junction and the ratio $I_{220}/I_{111}$ of the integral intensity of (220) X-ray diffraction to the integral intensity of (111) X-ray diffraction of the i-layer is 5 or more, thereby obtaining a thin-film solar cell having higher photoelectric conversion efficiency.

According to a manufacturing method of a multi-junction type thin-film solar cell, a solar cell having the above-mentioned characteristics can easily and simply be manufactured with a good yield, to thereby be capable of realizing the reduction in manufacturing cost.

What is claimed is:

1. A thin-film solar cell comprising:
   a transparent conductive layer and a photoelectric conversion layer laminated in this order on a substrate,
   wherein the photoelectric conversion layer comprises a p-i-n junction, and an i-layer of the p-i-n junction is made of a crystalline layer,
   the transparent conductive layer is provided with a plurality of holes at its surface of the side of the photoelectric conversion layer, each of said holes having irregularities formed on its surface,
   wherein the holes are provided on the surface of the transparent conductive layer in an amount of from 0.5 to 2 holes per micro square meter, and
   wherein a plurality of holes are formed on the surface of the substrate, each of said holes having irregularities formed on its surface.

2. A thin-film solar cell claimed in claim 1, wherein a diameter of each hole formed on the surface of the transparent conductive layer is in the range of 200 nm to 2000 nm, the depth of each hole formed on the surface of the transparent conductive layer is in the range of 50 nm to 1200 nm and a difference in height between each irregularity formed on the surface of the respective hole is in the range of 10 nm to 300 nm.

3. A thin-film solar cell claimed in claim 1, wherein additional irregularities are formed on the surface of the transparent conductive layer in areas between the holes of the transparent conductive layer, and a difference in height between each of said additional irregularities formed between the holes is in the range of 10 nm to 300 nm.

4. A thin-film solar cell claimed in claim 1, wherein the transparent conductive layer is made mainly of zinc oxide.

5. A thin-film solar cell claimed in claim 1, wherein the i-layer constituting the photoelectric conversion layer includes silicon or silicon alloy.

6. A thin-film solar cell claimed in claim 1, wherein the ratio $I_{220}/I_{111}$ of the integral intensity of (220) X-ray diffraction to the integral intensity of (111) X-ray diffraction of the i-layer is 5 or more.

7. A thin-film solar cell claimed in claim 1, wherein the transparent conductive layer is oriented with respect to the substrate surface.

8. A method of manufacturing the thin-film solar cell of claim 1, characterized in that a surface of the substrate and/or the transparent conductive layer is etched for forming said plurality of holes on the surface of the transparent conductive layer at the side of the photoelectric conversion layer.

9. A method of manufacturing the thin-film solar cell of claim 1, characterized in that the transparent conductive layer is formed so as to have the plurality of holes on its surface, whereby said plurality of holes are provided on the surface of the transparent conductive layer at the side of the photoelectric conversion layer.

10. A thin-film solar cell comprising:
    two or more sets of a transparent conductive layer and a photoelectric conversion layer laminated in this order on a substrate,
    wherein a plurality of holes are provided on a surface at a side of a first photoelectric conversion layer of a first transparent conductive layer that is the closest layer to the substrate as well as on a surface at a side of a second photoelectric conversion layer of a second transparent conductive layer formed on the first transparent conductive layer, each of said holes having irregularities formed on its surface, the photoelectric conversion layers each comprise a p-i-n junction, and an i-layer of the p-i-n junction of the first photoelectric conversion layer is made of an amorphous or a crystalline layer and the i-layer of each of the other photoelectric conversion layers is made of a crystalline layer, wherein, for at least one of the first and second conductive layers, the holes are provided on the surface of the transparent conductive layer in an amount of from 0.5 to 2 holes per micro square meter, and wherein a plurality of holes are formed on the surface of the substrate, each of said holes having irregularities formed on its surface.

11. A thin-film solar cell claimed in claim 10, wherein a diameter of each hole formed on the surface of the first and second transparent conductive layer is in the range of 200 nm to 2000 nm, the depth of each hole formed on the surface of the first and second transparent conductive layer is in the range of 50 nm to 1200 nm and a difference in height between each irregularity formed on the surface of the respective hole is in the range of 10 nm to 300 nm.

12. A thin-film solar cell claimed in claim 10, wherein a difference in height between each irregularity formed on the surface of each hole provided on the surface of the second transparent conductive layer is smaller that that formed on the surface of each hole provided on the surface of the first transparent conductive layer.

13. A thin-film solar cell claimed in claim 10, wherein additional irregularities are formed on the surface of the second transparent conductive layer between the holes of the second transparent conductive layer, and a difference in height between each of the additional irregularities formed on the surface of the second transparent conductive layer between the holes therein is in the range of 10 nm to 300 nm.

14. A thin-film solar cell claimed in claim 10, wherein at least one of the transparent conductive layers is made mainly of zinc oxide.

15. A thin-film solar cell claimed in claim 10, wherein the thickness of the photoelectric conversion layer including the amorphous i-layer is one to four times as large as the average height difference between each irregularity formed on the surface of each hole provided on the first transparent conductive layer.

16. A thin-film solar cell claimed in claim 10, wherein the i-layer of at least one of the photoelectric conversion layers includes silicon or silicon alloy.

17. A thin-film solar cell claimed in claim 10, wherein the ratio $I_{220}/I_{111}$ of the integral intensity of (220) X-ray diffraction to the integral intensity of (111) X-ray diffraction of at least one of the crystalline i-layers is 5 or more.

18. A thin-film solar cell claimed in claim 10, wherein the first transparent conductive layer is oriented with respect to the substrate surface.

19. A method of manufacturing the thin-film solar cell of claim 10, characterized in that a surface of at least one of the substrate, the first transparent conductive layer and the second transparent conductive layer is etched for forming said plurality of holes on the surface of the first transparent conductive layer and on the surface of the second transparent conductive layer.

20. A method of manufacturing the thin-film solar cell of claim 10, characterized in that the first transparent conductive layer and/or the second transparent conductive layer is formed so as to have a plurality of holes on its surface, whereby said plurality of holes are provided on the surface of the first transparent conductive layer and on the surface of the second transparent conductive layer.

21. A thin-film solar cell comprising:

a transparent conductive layer and a photoelectric conversion layer laminated in this order on a substrate, wherein the photoelectric conversion layer comprises a p-i-n junction, and an i-layer of the p-i-n junction is crystalline, the transparent conductive layer is provided with a plurality of holes at its surface of the side of the photoelectric conversion layer, each of said holes having irregularities formed on its surface, wherein the holes are provided on the surface of the transparent conductive layer in an amount of from 0.5 to 2 holes per micro square meter, and wherein the ratio $I_{220}/I_{111}$ of the integral intensity of (220) X-ray diffraction to the integral intensity of (111) X-ray diffraction of the i-layer is 5 or more.

22. A thin-film solar cell comprising:

two or more sets of a transparent conductive layer and a photoelectric conversion layer laminated in this order on a substrate, wherein a plurality of holes are provided on a surface at a side of a first photoelectric conversion layer of a first transparent conductive layer that is the closest layer to the substrate as well as on a surface at a side of a second photoelectric conversion layer of a second transparent conductive layer formed on the first transparent conductive layer, each of said holes having irregularities formed on its surface, the photoelectric conversion layers each comprise a p-i-n junction, and an i-layer of the p-i-n junction of the first photoelectric conversion layer is made of an amorphous or a crystalline layer and the i-layer of each of the other photoelectric conversion layers is made of a crystalline layer, wherein, for at least one of the first and second conductive layers, the holes are provided on the surface of the transparent conductive layer in an amount of from 0.5 to 2 holes per micro square meter, and wherein the ratio $I_{220}/I_{111}$ of the integral intensity of (220) X-ray diffraction to the integral intensity of (111) X-ray diffraction of at least one of the crystalline i-layers is 5 or more.

23. A thin-film solar cell claimed in claim 21, wherein a plurality of holes are formed on the surface of the substrate, each of said holes having irregularities formed on its surface.

24. A thin-film solar cell claimed in claim 21, wherein a diameter of each hole formed on the surface of the transparent conductive layer is in the range of 200 nm to 2000 nm, the depth of each hole is in the range of 50 nm to 1200 nm and a difference in height between each irregularity formed on the surface of the respective hole is in the range of 10 nm to 300 nm.

25. A thin-film solar cell claimed in claim 21, wherein additional irregularities are formed on the surface of the transparent conductive layer in areas between the holes of the transparent conductive layer, and a difference in height between each of said additional irregularities formed between the holes is in the range of 10 nm to 300 nm.

26. A thin-film solar cell claimed in claim 21, wherein the transparent conductive layer is made mainly of zinc oxide.

27. A thin-film solar cell claimed in claim 21, wherein the i-layer includes silicon or silicon alloy.

28. A thin-film solar cell claimed in claim 21, wherein the transparent conductive layer is oriented with respect to the substrate surface.

29. A method of manufacturing the thin-film solar cell of claim 21, characterized in that a surface of the substrate and/or the transparent conductive layer is etched for forming said plurality of holes on the surface of the transparent conductive layer at the side of the photoelectric conversion layer.

30. A method of manufacturing the thin-film solar cell of claim 21, characterized in that the transparent conductive layer is formed so as to have the plurality of holes on its surface, whereby said plurality of holes are provided on the surface of the transparent conductive layer at the side of the photoelectric conversion layer.

31. A thin-film solar cell claimed in claim 22, wherein a plurality of holes are formed on the surface of the substrate, each of said holes having irregularities formed on its surface.

32. A thin-film solar cell claimed in claim 22, wherein a diameter of each hole formed on the surface of the first and second transparent conductive layer is in the range of 200 nm to 2000 nm, the depth of each hole is in the range of 50 nm to 1200 nm and a difference in height between each irregularity formed on the surface of the respective hole is in the range of 10 nm to 300 nm.

33. A thin-film solar cell claimed in claim 22, wherein a difference in height between each irregularity formed on the surface of each hole provided on the surface of the second transparent conductive layer is smaller that that formed on the surface of each hole provided on the surface of the first transparent conductive layer.

34. A thin-film solar cell claimed in claim 22, wherein additional irregularities are formed on the surface of the second transparent conductive layer between the holes of the second transparent conductive layer, and a difference in height between each of the additional irregularities formed on the surface of the second transparent conductive layer between the holes therein is in the range of 10 nm to 300 nm.

35. A thin-film solar cell claimed in claim 22, wherein at least one of the transparent conductive layers is made mainly of zinc oxide.

36. A thin-film solar cell claimed in claim 22, wherein the thickness of the photoelectric conversion layer including the amorphous i-layer is one to four times as large as the average height difference between each irregularity formed on the surface of each hole provided on the first transparent conductive layer.

37. A thin-film solar cell claimed in claim 22, wherein the i-layer of at least one of the photoelectric conversion layers includes silicon or silicon alloy.

38. A thin-film solar cell claimed in claim 22, wherein the first transparent conductive layer is oriented with respect to the substrate surface.

39. A method of manufacturing the thin-film solar cell of claim 22, characterized in that a surface of at least one of the substrate, the first transparent conductive layer and the second transparent conductive layer is etched for forming said plurality of holes on the surface of the first transparent conductive layer and on the surface of the second transparent conductive layer.

40. A method of manufacturing the thin-film solar cell of claim 22, characterized in that the first transparent conductive layer and/or the second transparent conductive layer is formed so as to have a plurality of holes on its surface, whereby said plurality of holes are provided on the surface of the first transparent conductive layer and on the surface of the second transparent conductive layer.

* * * * *